United States Patent [19]

Honda et al.

[11] Patent Number: 5,759,710

[45] Date of Patent: Jun. 2, 1998

[54] MAGNETIC RECORDING MEDIUM WITH A MAGNETIC LAYER HAVING A SPECIFIC OXYGEN SIGNAL STRENGTH PROFILE IN THE THICKNESS DIRECTION

[75] Inventors: Kazuyoshi Honda, Osaka; Yoshiharu Maezawa, Shiga; Masaru Odagiri, Hyogo; Sadayuki Okazaki, Osaka, all of Japan

[73] Assignee: Matsushita Electric Industrial Co., Ltd., Osaka, Japan

[21] Appl. No.: 513,539

[22] Filed: Aug. 10, 1995

[30] Foreign Application Priority Data

Aug. 18, 1994 [JP] Japan ................................. 6-194005
Apr. 19, 1995 [JP] Japan ................................. 7-093340

[51] Int. Cl.[6] ................................................... G11B 5/64
[52] U.S. Cl. ................................. 428/694 T; 428/694 TS; 428/702; 428/900
[58] Field of Search ..................... 428/694 T, 694 TS, 428/900, 702

[56] References Cited

U.S. PATENT DOCUMENTS 4,855,175   8/1989   Wakai et al. ........................ 428/148
5,073,449  12/1991   Niimi et al. ........................ 428/336

OTHER PUBLICATIONS

"Recording Characteristics of Obliquely Evaporated Thin Co–O Films", *Journal of the Magnetics Society of Japan*, vol. 18, Supplement, No. S1 (1994), pp. 431–434.

*Primary Examiner*—Stevan A. Resan

[57] ABSTRACT

A method and a device for manufacturing a thin film by a vacuum deposition method, and a magnetic recording medium produced thereby are disclosed. A thin film of high quality is mass-produced while introducing reaction gas to a thin film forming section from a nozzle consisting of minute tubes, so that the flow of evaporated atoms is not disturbed by the reaction gas.

5 Claims, 26 Drawing Sheets

(First Aperture)/(Second Aperture)
Contribution Ratio of Film Thickness

MAGNETIC RECORDING MEDIUM WITH A MAGNETIC LAYER HAVING A SPECIFIC OXYGEN SIGNAL STRENGTH PROFILE IN THE THICKNESS DIRECTION

FIELD OF THE INVENTION

This invention relates to a method and a device for manufacturing a thin film, and further relates to a magnetic recording medium. More specifically, this invention relates to a device and a method of manufacturing a thin film and a magnetic recording medium useful for magnetic tapes.

BACKGROUND OF THE INVENTION

In modern society, thin films are widely used in our daily life. Particularly, thin films used for wrapping paper, magnetic tapes, capacitors, etc. are manufactured by a continuous winding vacuum deposition method which allows for high speed mass production. Research and development of thin film magnetic recording media is widely practiced so as to increase recording density. Among highly dense magnetic recording thin film media, Co oxide-based thin films are popular, being commercialized for video tapes.

As a method of manufacturing tape-type Co oxide-based thin film magnetic recording media, the continuous winding vacuum deposition method (Journal of the Magnetic Society of Japan, Vol. 18, Supplement, No. S1 (1994), Proceedings of the Third Perpendicular Magnetic Recording Conference '94, page 439–442) is generally applied. The method is excellent in its productivity. A conventional continuous winding vacuum deposition method is explained by FIG. 2. Referring to the figure, an electron beam 6 is irradiated so as to deposit magnetic layer on a film on a long macromolecular substrate 4 while the substrate is running along the surface of a cylinder can 5. As a result, magnetic recording media are mass produced. In other words, long macromolecular substrate 4 is unwound from a unwinding roller 3 in a rotating direction 12 in a vacuum container 2, which is vacuum exhausted by an exhaust system 1. The substrate is irradiated by means of electron beam 6 while the substrate is running along the surface of cylinder can 5. After the substrate is deposited by an electron beam deposition source 7 at the aperture of a shielding plate 9, it is wound by a winding roller 10. Reaction gas is introduced from a gas-introducing nozzle 8 so as to carry out reactive deposition. In the figure, 10 is the winding roller, 11 is a guide roller, 12 indicates the rotating direction, and 21 is an electron gun. Co or Co—Ni is used as a magnetic material. Since the reactive deposition are carried out in an oxygen atmosphere by introducing oxygen from gas-introducing nozzle 8, a long Co—O or Co—Ni—O magnetic tape is manufactured. Due to the reactive deposition in an oxygen atmosphere, crystal particles constituting the thin film separate magnetically, thus increasing coercive force. In addition, oxidized sections formed on the surface of the film and between crystal grain boundaries prevent rust, thereby improving the hardness of the film and its mechanical durability.

As mentioned above, the continuous winding deposition method is suitable for mass-producing thin films and can improve the properties of a thin film by the above-mentioned reactive deposition. However, gas introduced to the deposition atmosphere scatters vaporized atoms even though it improves the properties of the film. The properties depend on the incidence angle of vaporized atoms into the substrate and the scattering conditions of the atoms, so that the properties decline when the flow of vaporized atoms is disturbed by introduced gas. Thus, gas should be introduced so as not to disturb the flow of vaporized atoms. In addition, the recording density of magnetic recording media should be improved since the amount of information for recording is further increasing with the development of the information age. Besides high recording density, mass productivity as well as the excellent recording and reproducing properties of the media are required in manufacturing the media. In order to reduce media noise and provide high C/N, conventional magnetic recording media should have a two-layered magnetic layer, so that the deposition of a magnetic layer has to be carried out twice. In order to make the orientation of magnetic particles the same, the second magnetic layer has to be formed after forming the first magnetic layer and then winding the first layer, so that the productivity of the media declines. Therefore, an improvement in recording density of the media is expected by introducing gas without disturbing the flow of vaporized atoms, while the mass productivity and the recording and reproducing properties of media are maintained.

SUMMARY OF THE INVENTION

It is an object of this invention to solve the above-mentioned conventional problems by providing a method and a device for manufacturing a thin film and a magnetic recording medium, thus improving the properties of a thin film by introducing gas without disturbing the flow of vaporized atoms and mass-producing magnetic recording thin films of high quality.

In order to accomplish this object, the first method of manufacturing a thin film of the invention is to form a thin film on a substrate by a vacuum deposition method. The thin film is formed while introducing reaction gas. The aggregate of gas flux is applied to a thin film forming section by a nozzle having minute tubes. A metal, an alloy metal or the like is used for the thin film. An example of the thin film is one made of a magnetic material such as Co—O, Co—Ni—O, or the like. As the reaction gas, any gas except inert gas can be applied. For instance, oxidizing gas such as oxygen gas, ozone gas or the like is used. In addition, nitrogen monoxide, nitrogen dioxide, carbon monoxide, carbon dioxide, chlorine gas or the like can also be applied. As in a sputtering method, nitrogen gas functions as reaction gas in an activating atmosphere such as a high-frequency excitation atmosphere, so that nitrogen gas can also be applied in an activating atmosphere. A preferable degree of vacuum for vacuum deposition depends on the evaporating source. However, the degree of vacuum applied for a conventional vacuum deposition method is applied to this invention. More specifically, $1 \times 10^{-2}$ torr or less degree of pressure can be applied to form a thin film.

It is preferable that the ratio of the inside diameter (D) of the minute tube to its length (L) is 1:10, or the value of L is greater than 10.

It is also preferable that the ratio of the inside diameter (D) of the minute tube to a center distance between the minute tube and a neighboring minute tube (X) is 1:4, or the value of X is smaller than 4.

It is further preferable that a reaction gas flux from the minute tube is excited by high-frequency excitation and is then targeted to a film forming section.

The second method of manufacturing a thin film of the invention is to form a magnetic layer directly or via a bottom layer by an electron beam deposition method on a long macromolecular substrate which runs along a supporting body in vacuum. Metals used for forming the magnetic layer are deposited on the substrate from a main aperture of a shielding plate which is applied to regulate the direction of the metals. At the same time, gas including oxygen is directed to the substrate at the deposition end side of the main aperture, and oxygen gas flux is directed to the film-forming area by the sub-aperture from a sub-aperture of the shielding plate on the deposition starting side of the main aperture.

It is preferable that a 6 nm thick or thicker non-magnetic layer is formed by a reaction deposition method with the flux of oxygen gas from the sub-aperture to a film forming section.

It is preferable that a gap between the edge of the main aperture on the deposition starting side and the supporting body is 5 mm or less.

It is also preferable that the minute tubes having the ratio (D/L), between the length (L) and the inside diameter (D), of 0.1 or less are applied so as to blow the flux of oxygen gas.

A seamless belt can also be used as the supporting body, though a cylindrical can is generally applied.

The third method of manufacturing a thin film of the invention is to form a magnetic layer directly or via a bottom layer by an electron beam deposition method on a long macromolecular substrate running along a supporting body in a vacuum. Metals used for forming the magnetic layer are deposited on the substrate from the aperture of a shielding plate which is deposited to regulate the direction of the metals. At the same time, gas including oxygen is directed to the substrate from the deposition end side of the aperture, and the flux of oxygen gas is oriented to the middle of the aperture from a nozzle positioned outside the gas flow forming the magnetic layer.

It is preferable that a non-magnetic layer is formed somewhere in the aperture by the oxygen gas provided from the nozzle.

It is also preferable that the ratio of the thickness of the magnetic layer on a substrate side relative to the thickness on a surface side is 3:1–8:1, when the magnetic layer is divided into the substrate side and the surface side by the extension line from the center of the nozzle.

A seamless belt can also be used as the supporting body, though a cylindrical can is generally applied.

The fourth method of manufacturing a thin film of the invention is to form a magnetic layer directly or via a bottom layer by an electron beam deposition method on a long macromolecular substrate running along a supporting body in a vacuum. Two apertures are formed in a shielding plate regulating the direction of metal used for forming the magnetic layer, and the metal is deposited on the substrate from the apertures. The thickness of a magnetic layer which is formed at the first aperture is larger than that of a magnetic layer which is formed at the second aperture. The flux of gas including oxygen is directed to the substrate from at least the deposition end of the second aperture.

It is preferable that the magnetic layer formed at the first aperture is from three to eight times as thick as the magnetic layer formed at the second aperture.

It is also preferable that the flux of gas including oxygen is directed to the substrate from the deposition end of the first aperture.

A seamless belt can also be used as the supporting body, though a cylindrical can is generally applied.

The first device for manufacturing a thin film of the invention includes a nozzle which blows reaction gas to a thin film forming section. The nozzle has of minute tubes.

It is preferable that the ratio of the inside diameter (D) of the minute tube to the length (L) of the tube is 1:10, or the value of L is greater than 10.

It is also preferable that the ratio of the inside diameter of the minute tube (D) to a center distance (X) between the minute tube and a neighboring minute tube is 1:4, or the value of X is smaller than 4. The relation between the inside diameter (D) and the center distance (X) is shown in FIG. 26.

It is further preferable that the device includes a section of the nozzle made of minute tubes and a section for exciting the reaction gas by high-frequency excitation, and that the latter section is connected to the former section.

The second device for manufacturing a thin film of the invention forms a thin film on a long macromolecular substrate running along a supporting body in a vacuum. The supporting body is a seamless belt. The device includes a shielding plate, which regulates the direction of atoms applied to form the thin film, and has a main aperture for depositing the thin film on the substrate, a nozzle for blowing gas to the substrate from the deposition end side of the main aperture, a sub-aperture in the shielding plate on the deposition starting side of the main aperture, and a nozzle for directing the flux of gas to the film-forming area by the sub-aperture from near the supporting body.

The third device for manufacturing a thin film of the invention forms a thin film on a long macromolecular substrate running along a supporting body in a vacuum. The supporting body is a seamless belt. The device includes a shielding plate, which is to control the direction of atoms applied to form the thin film and is formed with an aperture for depositing the thin film on the substrate, a nozzle for blowing gas from the deposition end of the aperture to the substrate, and a nozzle for orienting the flux of gas from the outside of the passing area of vapor flux forming the thin film.

The fourth device for manufacturing a thin film of the invention forms a thin film on a long macromolecular substrate running along a supporting body in a vacuum. The supporting body is a seamless belt. The device includes a shielding plate, which regulates the direction of atoms applied to form the thin film and is formed with two apertures for depositing the thin film on the substrate, and a nozzle for blowing the flux of gas from the deposition end side of each aperture to the substrate.

The first magnetic recording medium of the invention includes a thin magnetic layer formed directly or via a bottom layer on a substrate. The magnetic layer contains at least Co and O as main components. The magnetic layer, near its surface, contains more oxygen than other areas of the layer except for the section at the boundaries between itself and the substrate or the bottom layer. In addition, a section of the magnetic layer at 5 nm or below from its surface and above the boundaries between itself and the substrate or the bottom layer has roughly constant oxygen. The peak oxygen content at the section containing more oxygen mentioned above is at least 150 atm % as much as the average oxygen amount of the section containing the above-noted constant oxygen level.

The second magnetic recording medium of the invention includes a thin magnetic layer formed directly or via a bottom layer on a substrate. The oxygen signal strength of an Auger Depth profile measured from the surface of the magnetic layer shows peaks at least at the magnetic layer surface and at the mid-magnetic layer. The peak in the mid-magnetic layer is located at a depth of 11–25% down from the magnetic layer surface. The peak of the mid-magnetic layer is 60% or more as strong as that of the magnetic layer surface. The Auger Depth profile mentioned above is a method of carrying out the conventional Auger analysis by etching the thin film surface with an ion. As the ion, an Ar ion is used, and the etching rate is preferably around 2 nm/minute (20 angstroms/minute).

It is preferable that the width at half the height of the peak in the mid-magnetic layer is 20 nm or less.

It is also preferable that the magnetic layer includes Co and O as main components.

The third magnetic recording medium of the invention includes a thin magnetic layer via a non-magnetic layer formed on a substrate. The non-magnetic layer consists of the oxide of atoms constituting the magnetic layer. The oxygen signal strength of an Auger Depth profile measured from the magnetic layer surface has peaks at least on the magnetic layer surface and in the non-magnetic layer. The peak strength in the non-magnetic layer is at least 70% as much as that of the magnetic layer surface. The thickness on the side of the magnetic layer surface, where the oxygen signal strength of the non-magnetic layer is 90–50% as much as its peak, is 20 nm or less.

It is preferable that the magnetic layer contains at least Co and O as main components.

DETAILED DESCRIPTION OF THE INVENTION

This invention will be described by referring to the following illustrative examples and attached figures.

Example 1

Figure 1:
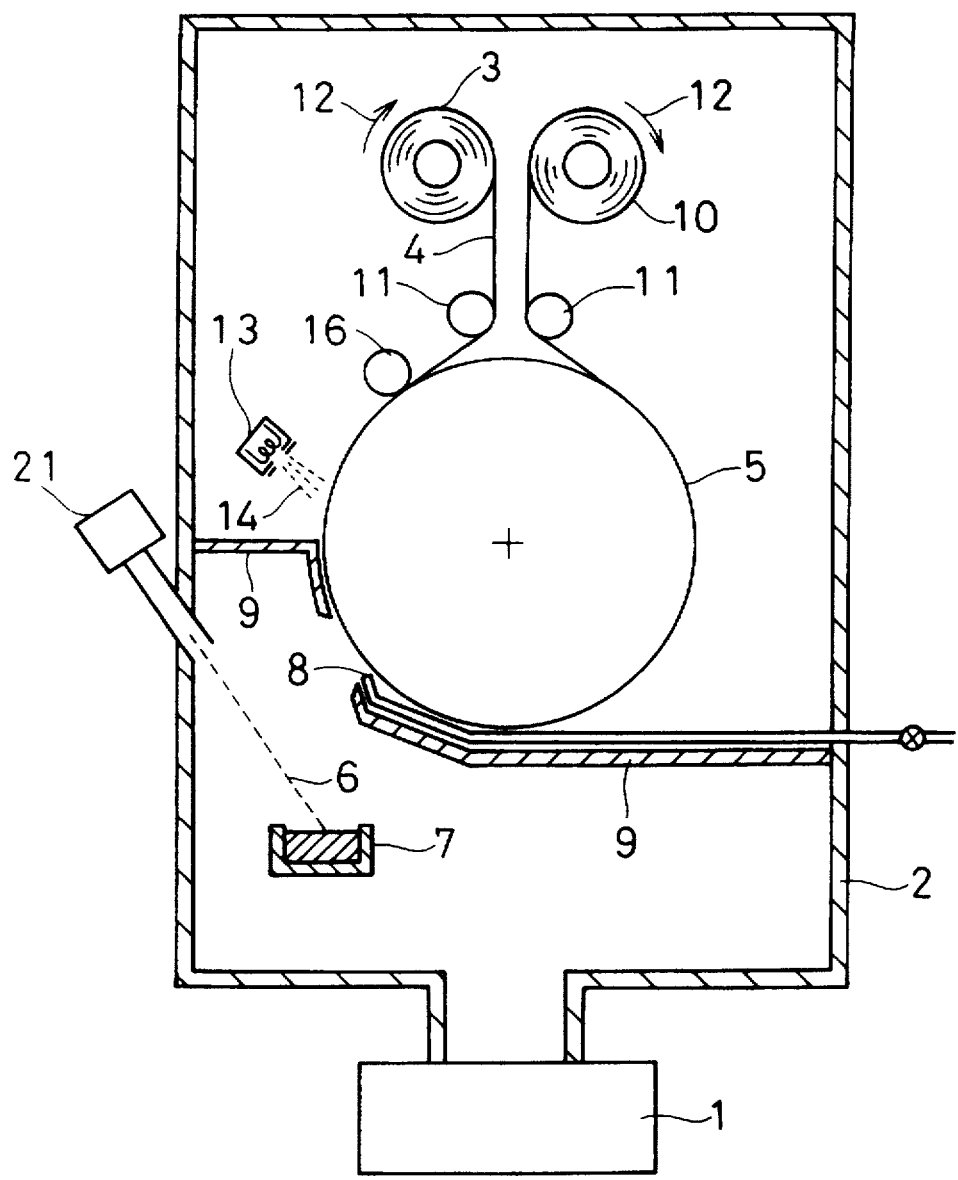
FIG. 1 is a diagram showing an embodiment of a method and device for manufacturing a thin film of the invention.
Figure 2:
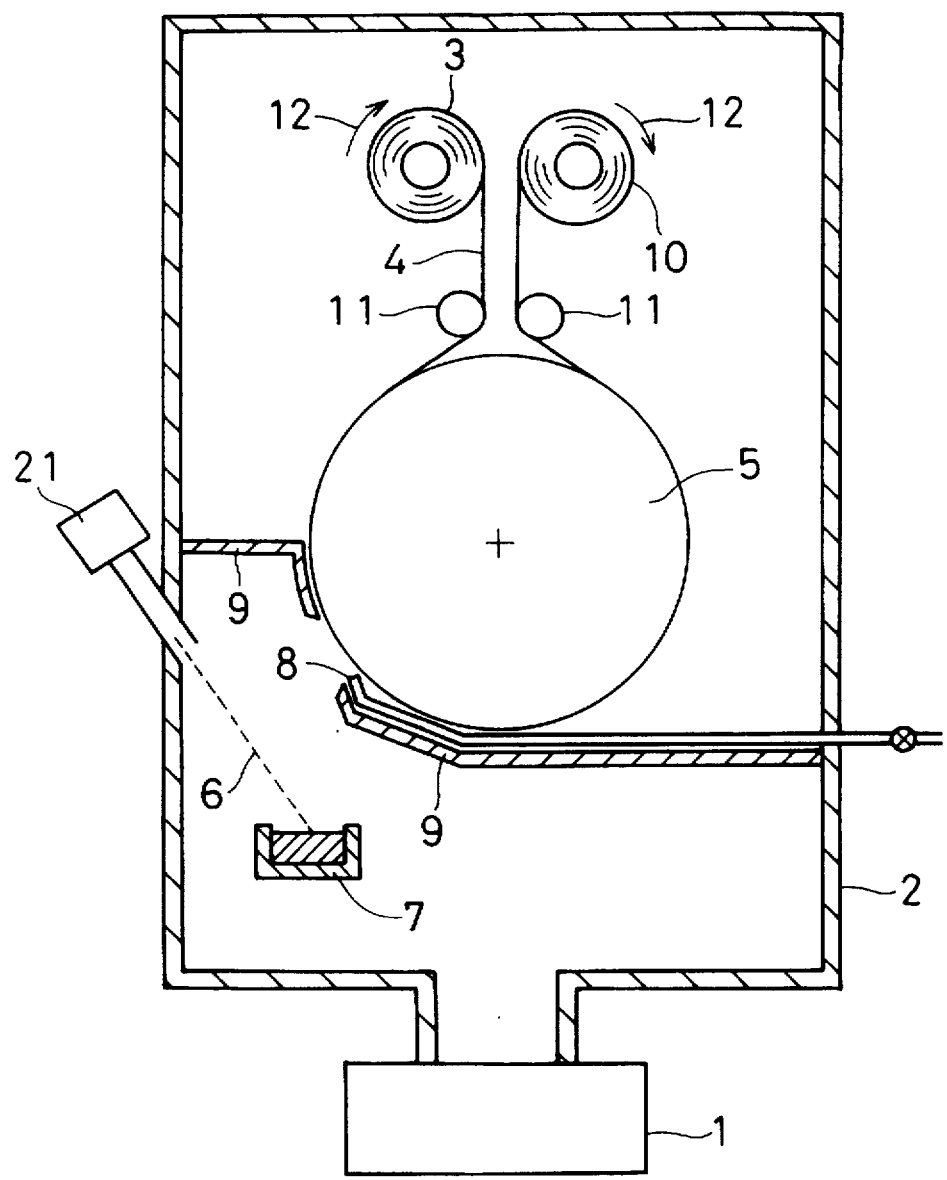
FIG. 2 is a diagram showing an embodiment of a conventional method and device for manufacturing a thin film.

The first example is explained by referring to FIG. 1. A long macromolecular substrate 4 is unwound from an unwinding roller 3 in a rotational direction 12 in a vacuum container 2, which is vacuum exhausted by an exhaust system 1. A deposit is formed on the substrate at the aperture of a shielding plate 9 by an evaporating source 7 which is irradiated with an electron beam 6, while the substrate is running along the surface of a cylindrical can 5. Then, the substrate is wound by a winding roller 10. Reaction and deposition can be carried out by introducing reaction gas from a gas-introducing nozzle 8. In order to increase the adherence between the macromolecular substrate and the can, the substrate can be pressed against the can by a nip roller 16 and irradiated with an electron beam 14 used for providing adherence from an electron gun 13. The nip roller and the electron gun can be removed from the device when they are unnecessary.

As an example of manufacturing a thin film magnetic tape, a 2000 m long, 200 mm wide and 10 μm thick polyethylene terephthalate film was used as a macromolecular resin substrate (film or sheet). With 40 m/minute winding speed and oxygen gas as the reaction gas, two 70 nm thick Co—O magnetic layers were laminated. The incidence angle of vapor to the first and the second layer was from 70 to 50 degrees relative to the normal line of the substrate. The extension line of the gas-introducing nozzle was directed toward a deposition end section. The cylindrical can was cooled by cooling water circulating inside the can and having an ordinary temperature. The degree of vacuum in the deposition chamber during the film forming process was about $5\times10^{-5}$ torr.

The properties of the magnetic tape were evaluated by the coercive force measured by a vibrating sample magnetometer, and recording and reproducing properties measured by a MIG head. The recording and reproducing properties of the magnetic tape were measured by comparing its C/N at 0.5 μm recording wavelength with the C/N of a deposition tape used for videos sold on the market (ME tape). Scratch tests based on the JIS-K 6718 testing method were also carried out on some samples.

Figure 3:
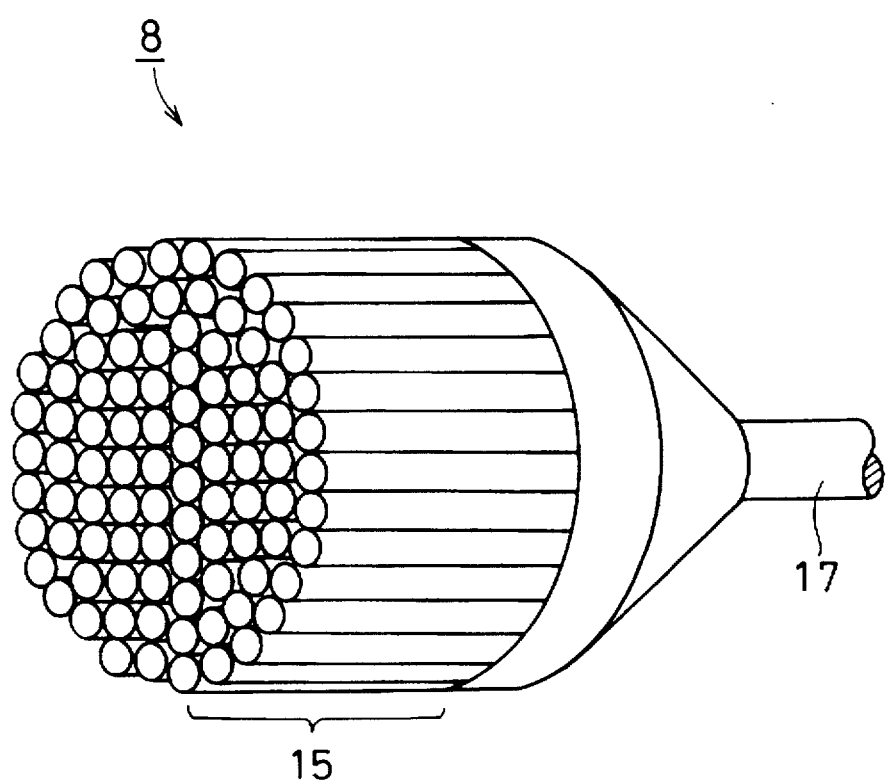
FIG. 3 is a diagram showing an embodiment of a gas-introducing nozzle of the invention.

The magnetic tape was manufactured by using a gas-introducing nozzle shown in FIG. 3, and the properties of the tape were compared with those of another tape manufactured by using a nozzle with different shapes. The nozzle shown in FIG. 3 has multiple tubes at the end, and is connected to a gas-introducing pipe so as to provide almost the same amount of gas to each tube.

The inside diameter ($\phi p$) of the tube was changed, and the number of tubes was arranged so as to keep the total internal tube area constant. The magnetic layer was formed by directing oxygen gas to a layer forming section. The length of the subdivided nozzle section was fixed to 30 mm. The distance between the nozzle edge and the substrate was 100 mm.

Figure 4:
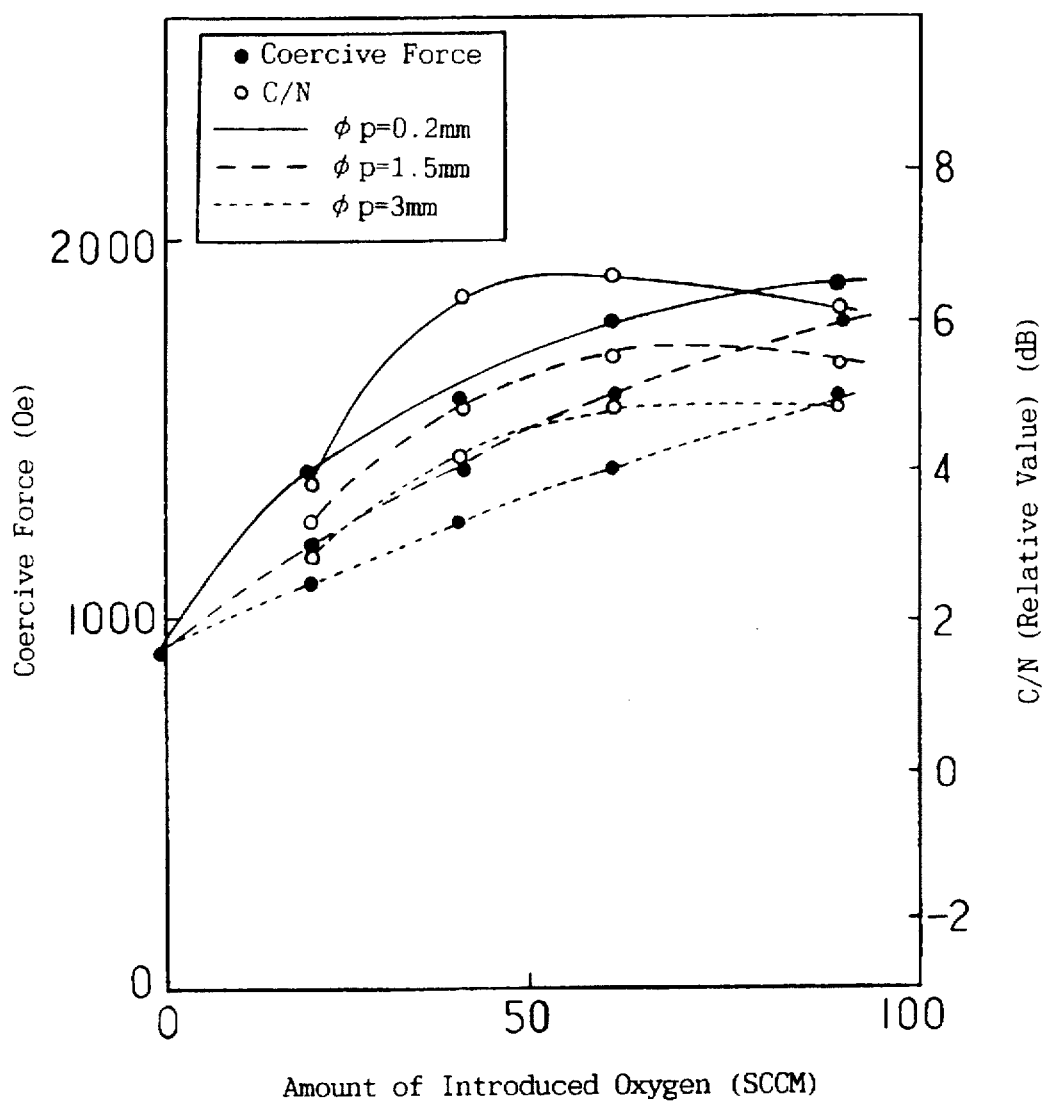
FIG. 4 is a graph showing the correlation between the amount of introduced oxygen and film properties of the invention when the inside diameter of a tube ($\phi p$) is varied.
Figure 5:
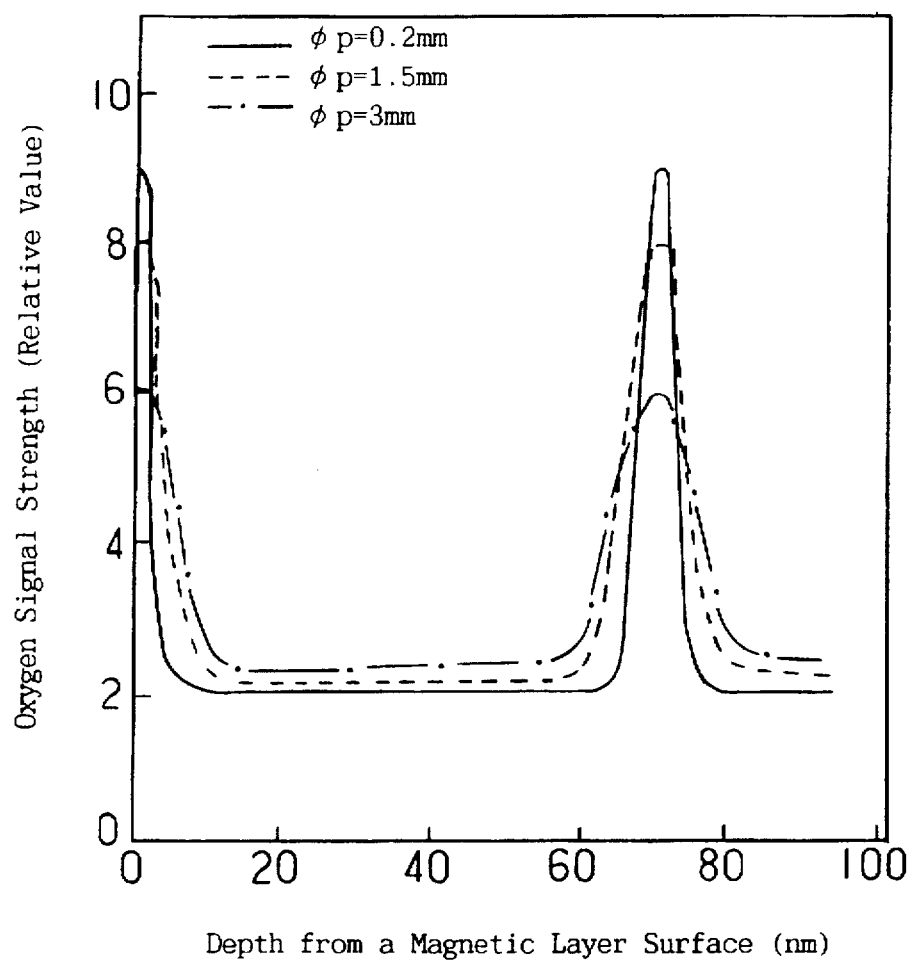
FIG. 5 is a graph showing the results of an Auger Depth profile of the invention while the inside diameter of a tube ($\phi p$) is changed.

FIG. 4 shows the correlation between the amount of introduced oxygen and film properties when the inside diameter ($\phi p$) of the tube was changed. According to the figure, high coercive force is obtained with a small amount of oxygen as the inside diameter ($\phi p$) becomes small. At the same level of coercive force, high C/N is obtained as the inside diameter ($\phi p$) becomes small. In other words, film properties are improved when subdivided gas is introduced. This is because the collision among gas atoms inside the tube is reduced, and the flow of gas is uniformly oriented along the lengthwise direction of the nozzle. Thus, by efficiently orienting the reaction gas to a reaction region of the thin film, the flow of vaporized atoms becomes less disorderly. Furthermore, at the same coercive force, not only high C/N but also improved endurance is obtained by subdividing the flow of the reaction gas. For example, a medium having 1400 oersted coercive force was used for a scratch test, and the medium with $\phi p=1.5$ mm or 0.2 mm had a scratch strength which is 1.5 or 2 times as strong as the scratch strength of a medium with $\phi p=3$ mm. This is probably because of an increase in the packing factor of the thin film from reducing the amount of introduced gas. It is extremely important to provide a magnetic recording medium having not only excellent recording and reproducing properties but also other properties; particularly in a thin film magnetic recording medium, an advanced technique to maintain mechanical properties with a thin film thickness is required. In this sense, this invention is useful. In order to test the difference in film structures by subdividing introduced gas, a medium with 1400 oersted coercive force was applied so as to measure an Auger Depth profile at $\phi p=0.2$ mm and 3 mm. The results are shown in FIG. 5. As shown in the figure, an oxidized area near the surface of the magnetic layer is formed more distinctively at $\phi p=0.2$ mm than the area at $\phi p=3$ mm. The magnetic layer formed with $\phi p=0.2$ mm has almost constant oxygen density except at an initially grown section and a thin oxidized area close to the surface. As mentioned above, the collision among gas atoms inside the nozzle is reduced, and the direction of reaction gas flow is oriented to the lengthwise direction of the nozzle edge which is shown in FIG. 3. Thus, the reaction gas was efficiently directed to a reaction region. According to the results shown in FIG. 5, the properties of a magnetic recording medium are excellent when the oxidized area close to the magnetic layer surface is formed distinctively and the oxygen density is almost constant, except for a thin oxidized area close to the magnetic layer surface and an initially grown section. In the figure, a section with abundant oxygen is within the region of 8 nm from the magnetic layer surface, when $\phi p$ is 3 mm. The section is within the region of 5 nm and 3 nm from the surface when $\phi p$ is 1.5 mm and 0.2 mm, respectively. Therefore, it is preferable that the area with abundant oxygen lies 5 nm or less from the magnetic layer surface.

Figure 6:
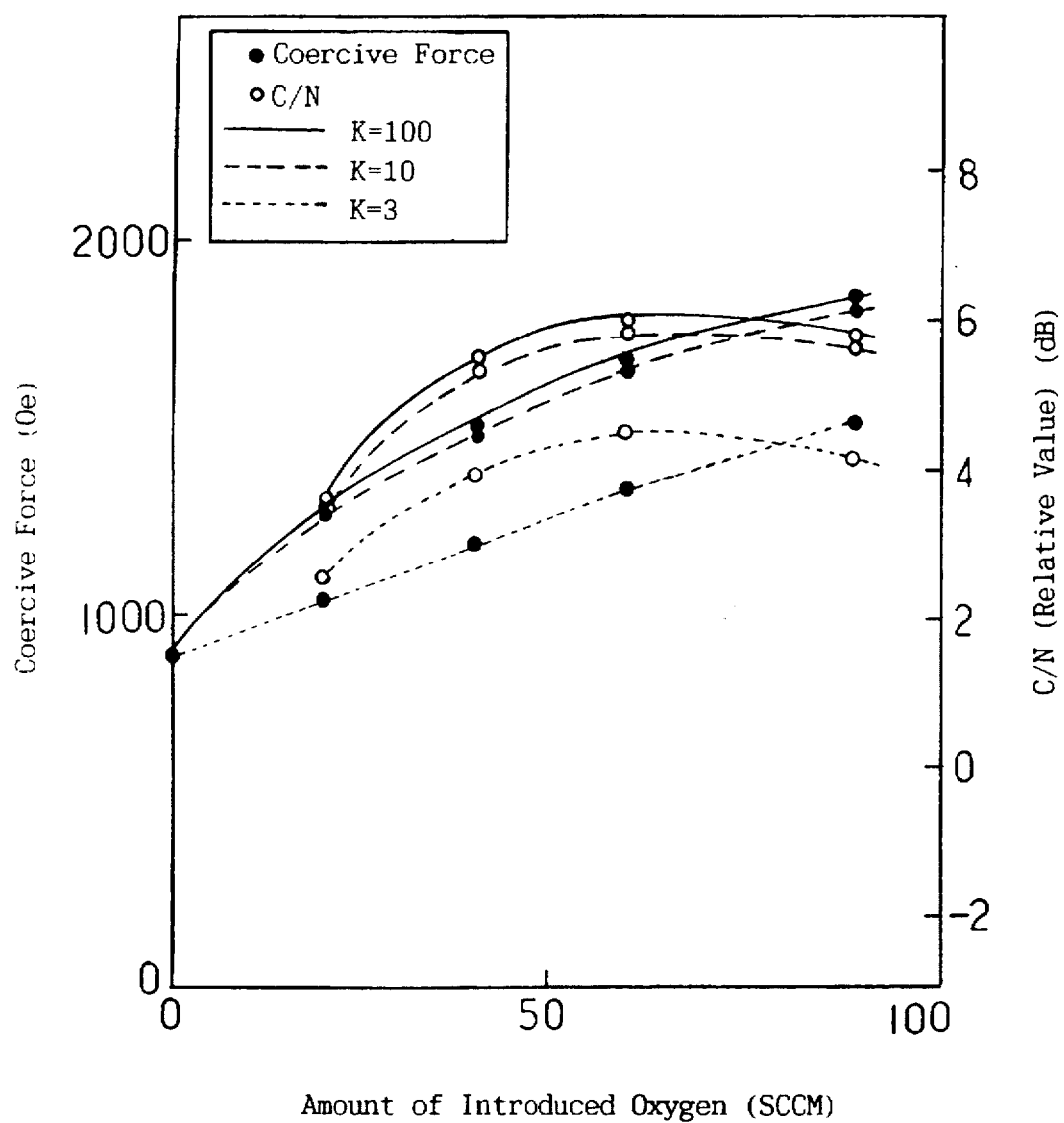
FIG. 6 is a graph showing the correlation between the amount of introduced oxygen and film properties of the invention when the length of a nozzle edge is changed.

The edge length of the gas-introducing nozzle having minute tubes with 0.6 mm inside diameter was changed. FIG. 6 shows the correlation between the amount of introduced oxygen and film properties when the length of the nozzle edge (K) relative to the inside diameter is changed. According to the figure, when the nozzle edge length is ten times or more as long as the inside diameter, high coercive force and C/N are obtained. As the ratio between the nozzle edge length and the inside diameter becomes large, the properties of a thin film improve. This is because the flow of reaction gas from the nozzle becomes orderly. Therefore, in order to utilize the gas-introducing nozzle including minute tubes at the edge, the ratio (K) of a nozzle edge length relative to an inside diameter of the tube should be set at a certain high level. More specifically, the ratio should be ten or more.

In addition, the thickness of a minute tube was changed while the inside diameter of the tube was set constant, so that film properties were tested while the ratio of the inside diameter of a minute tube relative to a center distance between the minute tube and a neighboring minute tube was varied. As a result, high coercive force and C/N are achieved when the center distance is four times or less as large as the inside diameter. This is because the flow of introduced gas molecules works uniformly as reaction gas. When the center distance is too large relative to the inside diameter, the effect of such a gas-introducing nozzle is insignificant; therefore, the ratio should be four or less.

Example 2

Figure 7:
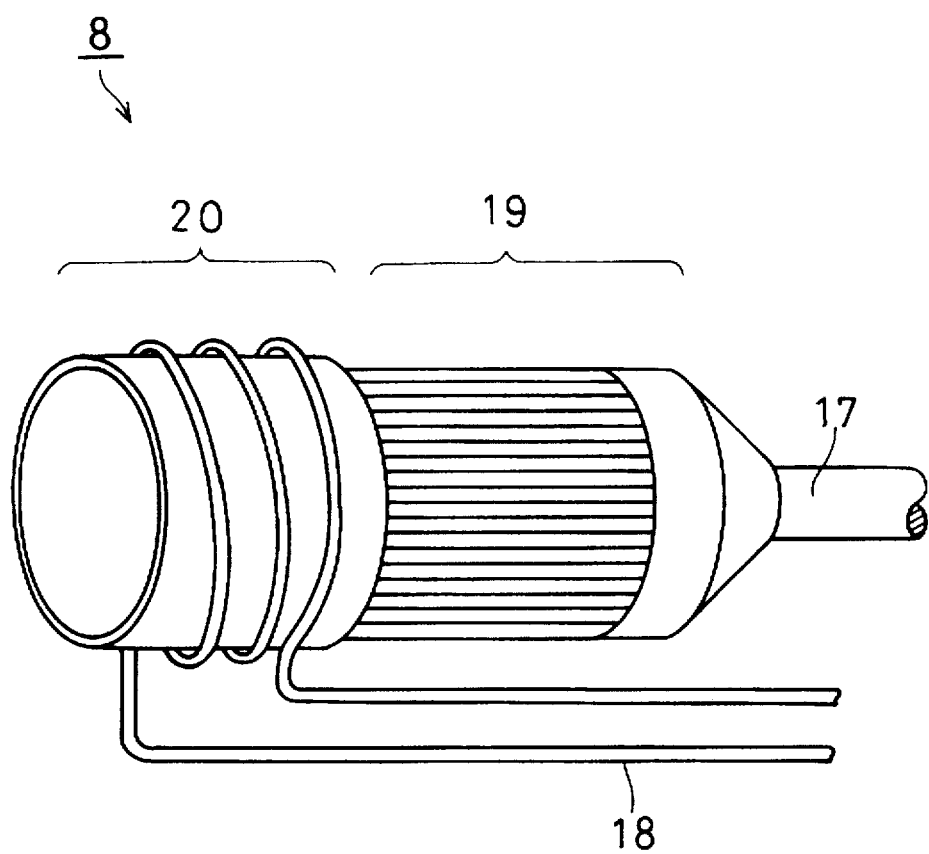
FIG. 7 is a diagram showing an embodiment of a two-stage nozzle of the invention.
Figure 8:
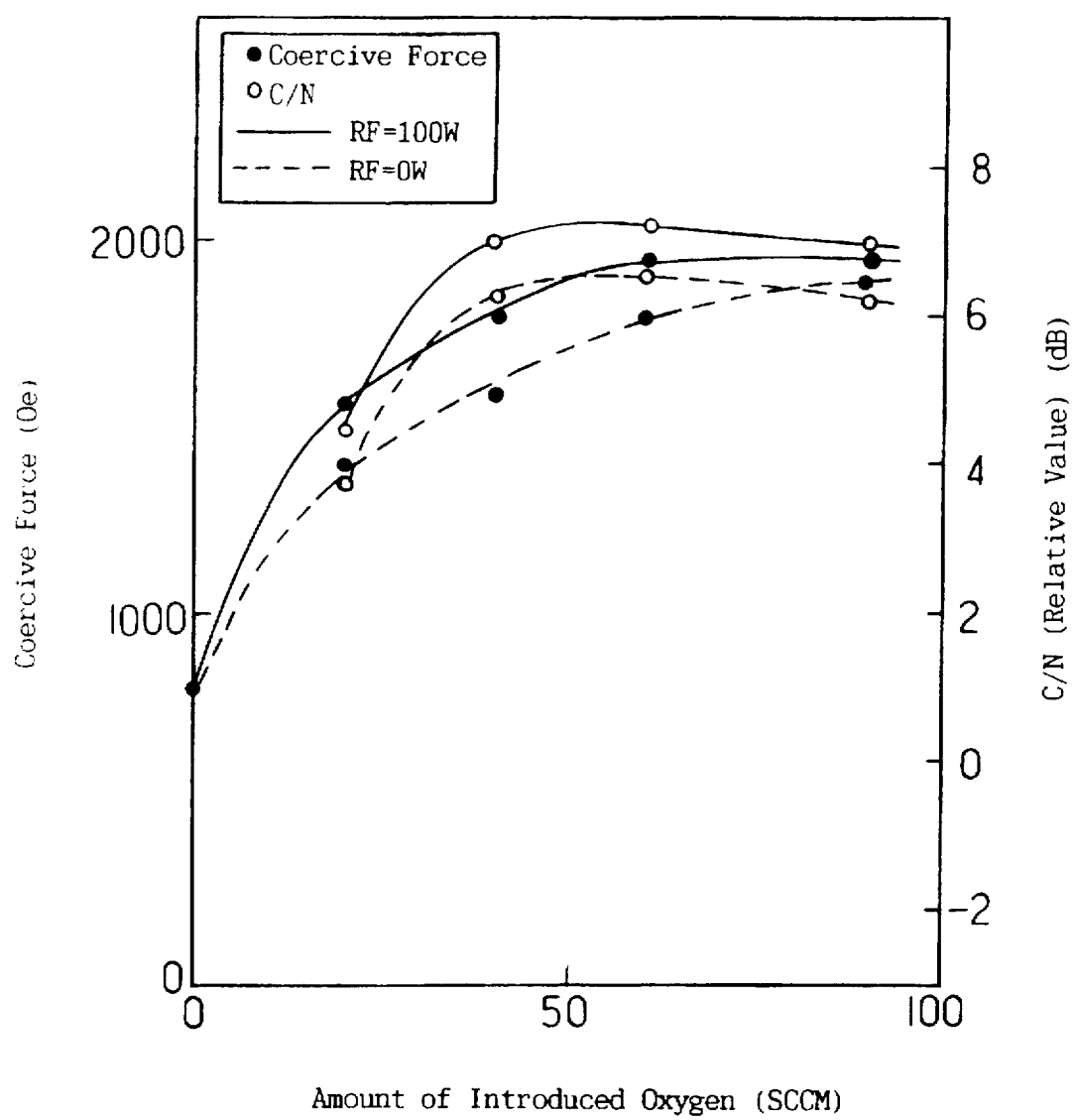
FIG. 8 is a graph showing the correlation between the amount of introduced oxygen and film properties of the invention when high-frequency electric power is changed.

A two-stage gas-introducing nozzle shown in FIG. 7 is applied in this example. The first stage 19 of the nozzle shown in the figure is basically the same as the one shown in FIG. 3. However, at the second stage 20 of the nozzle, high-frequency electric power is applied to excite introduced gas. 13.56 MHz high-frequency electric power was applied to the first stage having a 30 mm long subdivided section which consists of minute tubes with 0.2 mm inside diameter. FIG. 8 shows the correlation between the amount of introduced oxygen and film properties when high-frequency electric power is varied. As shown in the figure, high coercive force is obtained with less oxygen by adding high-frequency electric power to the oxygen. At the same coercive force, higher C/N is obtained with the application of high-frequency electric power. In other words, the properties of a thin film improve when high-frequency electric power is added to the introduced gas. This is because a part of the reaction gas is excited, and is ionized or becomes radical, thus increasing its reactivity. With the improved reactivity of introduced gas, the amount of gas required for obtaining high coercive force can be reduced, and reactive deposition can be carried out without disturbing a vaporized atom flow, so that the properties of a thin film improve.

As described in Examples 1 and 2, reactive deposition can be carried out efficiently with a small gas flow by applying a gas-introducing nozzle whose edge has numerous minute tubes and by orienting a reaction gas flow with a strong directivity to a film forming section. As a result, the properties of a thin film improve, increasing coercive force and C/N. In addition, when some reaction gas is excited, reaction efficiency further improves, thus improving the properties of a thin film.

In Examples 1 and 2, the recording and reproducing properties of a thin film were evaluated by coating lubricant on the surface of a magnetic layer. However, in order to further improve the mechanical properties, a protective layer can be formed on the surface of a magnetic layer, or lubricant can be coated on the protective layer in the invention.

Example 3

Figure 9:
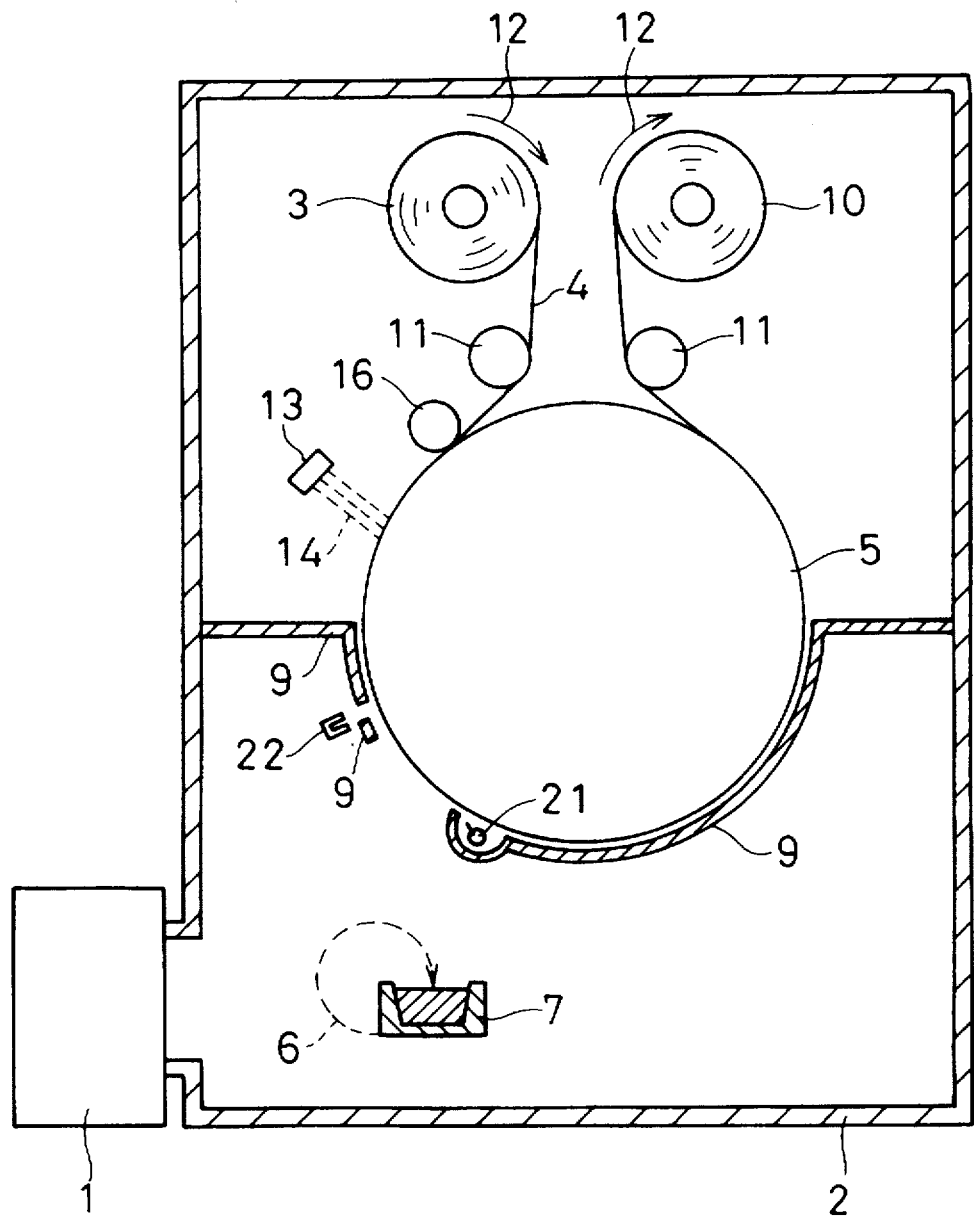
FIG. 9 is a diagram showing an embodiment of a method and device for manufacturing a thin film of the invention.

The third example of this invention is explained by referring to FIG. 9. A long macromolecular substrate 4 is unwound from an unwinding roller 3 in a rotational direction 12 in a vacuum container 2 which is vacuum exhausted by an exhaust system 1. A deposit is formed on the substrate at the aperture of a shielding plate 9 by an evaporation source 7 which is irradiated with an electron beam 6, while it is running along the surface of a cylindrical can 5. Then, the substrate is wound by a winding roller 10. In order to increase the adherence between the macromolecular substrate and the can, the substrate can be pressed against the can by a nip roller 16 and then irradiated with an electron beam 14 used for adding adhesion from an electron gun 13. The surface treatment or the like of the substrate can also be carried out by using an ion source. The nip roller and the electron gun can be removed from the device when they are unnecessary.

Reaction and deposition were carried out by directing gas including oxygen to the substrate from a main nozzle 21 on the deposition end of the aperture. The flux of oxygen gas was applied to the film-forming area by the sub-aperture from a sub-nozzle 22 from the top of the shielding plate aperture edge on the deposition starting side. In addition, a sub-aperture was formed in the shielding plate on the deposition starting side. Some of the vapor flow passing through the sub-aperture adhered to the substrate, and the flux of oxygen gas was directed mainly to the section of the substrate where the vapor passing through the sub-aperture adhered. The internal size of the sub-nozzle was 200×6×30 mm and had a box shape. The mouth was 200 mm wide in the direction of a substrate width and 6 mm long. The gap between the shielding plate edge on the deposition starting side and the supporting body was changed within the range of 1 mm and 10 mm, and the properties of a thin film magnetic tape were compared.

The extension line of gas-introducing main nozzle 21 was oriented to the aperture on the deposition end side. The extension line of sub-nozzle 22 was targeted mainly to the area where vapor passing through the sub-aperture adhered to the substrate. A cylindrical can was cooled by cooling water circulating inside the can and having an ordinary temperature. The degree of vacuum in the deposition chamber was about $5 \times 10^{-5}$ torr.

As the macromolecular substrate, a 30 cm wide and 10 µm thick polyethylene terephthalate film was used, and a 200 nm thick Co—O magnetic layer was formed. The incidence angle of vapor to the macromolecular substrate was from 80 to 40 degrees from the normal line of the substrate. The sub-aperture was formed in the shielding plate on the deposition starting side. Besides the 200 nm thick magnetic layer, 0–40 nm thick non-magnetic or low-saturation magnetization Co—O was formed before the deposition of the magnetic layer. In case of zero thickness Co—O by sub-aperture, sub-aperture was closed.

The thickness of the magnetic layer was measured by a film thickness measuring device using transmitted light which was deposited between guide rollers while the layer was deposited. The thickness was controlled by arranging the electric power of an electron gun. The measuring device consisted of a visible light source and a CDS element.

The magnetic properties of the magnetic layer were measured by a vibrating sample magnetometer. The recording and reproducing properties of the layer were evaluated with a MIG head. The C/N at 0.5 µm recording wavelength of this magnetic layer was compared with the C/N of a deposition tape which is used for videos sold on the market (ME tape).

Figure 10:
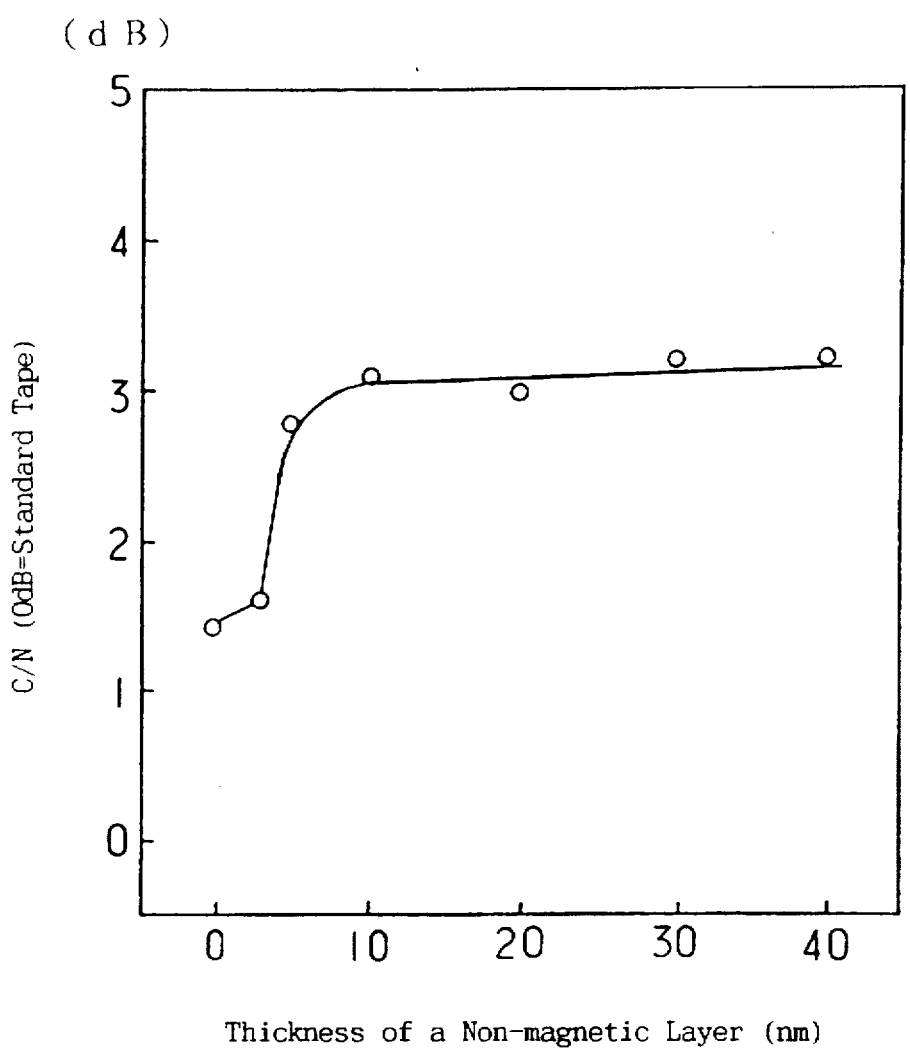
FIG. 10 is a graph showing the correlation between the thickness of a non-magnetic layer and the recording and reproducing properties of a thin film of the invention.

As shown in FIG. 10, the recording and reproducing properties of the layer improve significantly by forming a magnetic layer after forming a non-magnetic layer. Especially when the non-magnetic layer is 6 nm thick or more, the properties improve significantly, so that the thickness of the layer is preferably 6 nm or more. The properties also improve significantly when the gap between the shielding plate edge on the deposition starting side and the cylindrical can is 5 mm or less. However, if the gap is more than 5 mm, the properties decline as the gap widens. This is probably because oxygen gas from the sub-nozzle swirls about the aperture, thus disturbing the initial growth of the magnetic layer. Therefore, the gap between the shielding plate edge and the cylindrical can is preferably 5 mm or less.

Comparative Example 1

The same method as the method in Example 3 was applied in this example, except that a magnetic layer was formed after forming a non-magnetic layer and winding a macromolecular substrate, and that no sub-aperture was formed. The recording and reproducing properties were measured, and the results are shown in FIG. 11.

Figure 11:
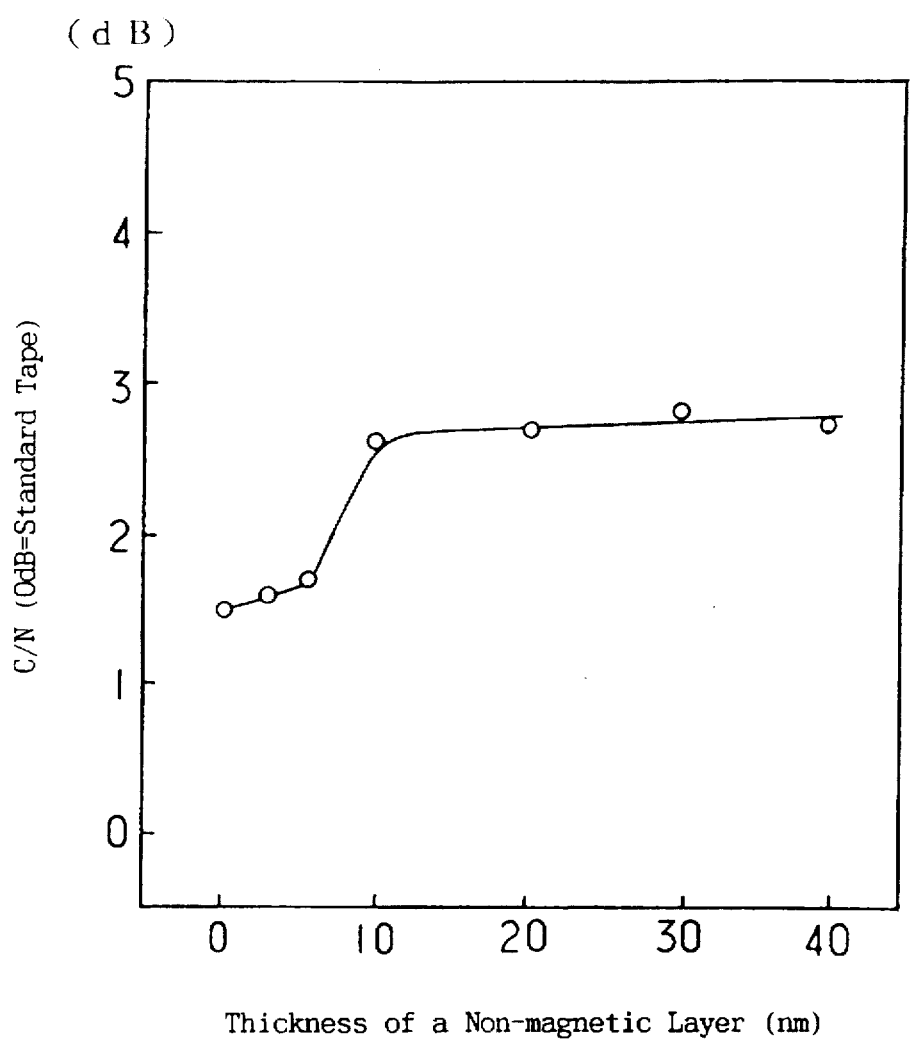
FIG. 11 is a graph showing the recording and reproducing properties of a thin film, when a macromolecular substrate is wound after being provided with a non-magnetic layer and is then provided with a magnetic layer.

As found by comparing FIG. 10 to FIG. 11, the recording and reproducing properties of a thin film manufactured by forming a magnetic layer right after forming a non-magnetic layer as in Example 3 are superior to those of a thin film which is manufactured by first forming a non-magnetic layer and then winding the substrate and then forming a magnetic layer. This is because the surface of the non-magnetic layer remains clean when the substrate is not wound before being formed with the magnetic layer. Thus, if the magnetic layer is formed right after forming the non-magnetic layer, the properties of the magnetic layer also improve.

Example 4

Figure 12:
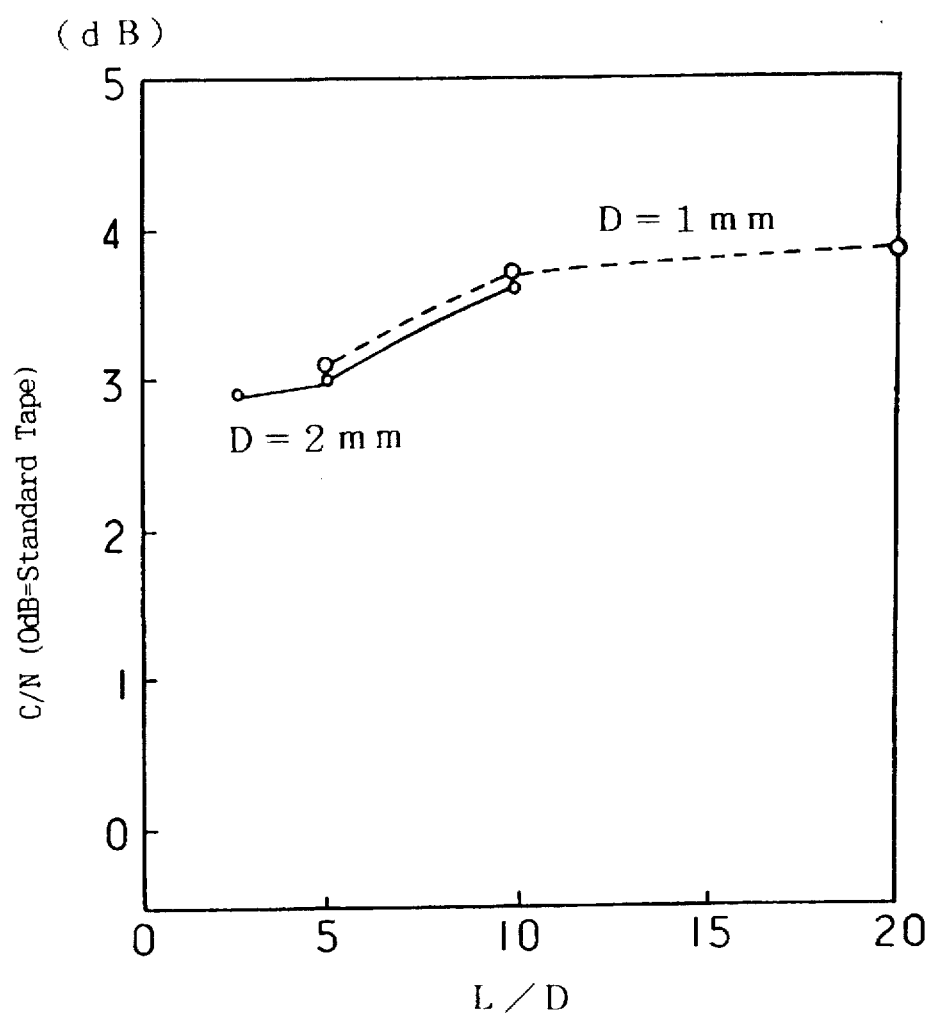
FIG. 12 is a graph showing the recording and reproducing properties of a thin film of the invention when the mouth shape of a gas introducing sub-nozzle is changed.

FIG. 12 shows the recording and reproducing properties of a thin film when the same method as in Example 3 was applied to form the film and the shape of edge of gas-introducing sub-nozzle 22 was changed. The internal size of the sub-nozzle was 200×6×L mm, and the mouth was wide in the direction of a substrate width and was 200×6 mm. L was changed to 5, 10 and 20. Stainless minute tubes were filled in the sub-nozzle, so that the introduced gas was the aggregated flux of gas from the minute tubes. Though the inside diameter (D) of the tube varies from 0.5 mm to 2 mm, 1 mm is mostly selected. As shown in FIG. 12, the recording and reproducing properties of a film improved, when L/D is 10 or more and the aggregated flux of gas was applied. In other words, when a sub-aperture was formed in the shielding plate on the deposition starting side and a non-magnetic layer was formed before the deposition of a magnetic layer, the properties improved by setting L/D equal to 10 or more with the application of the minute tubes. This is because the swirl of oxygen gas about a magnetic layer forming section is minimized.

Figure 13:
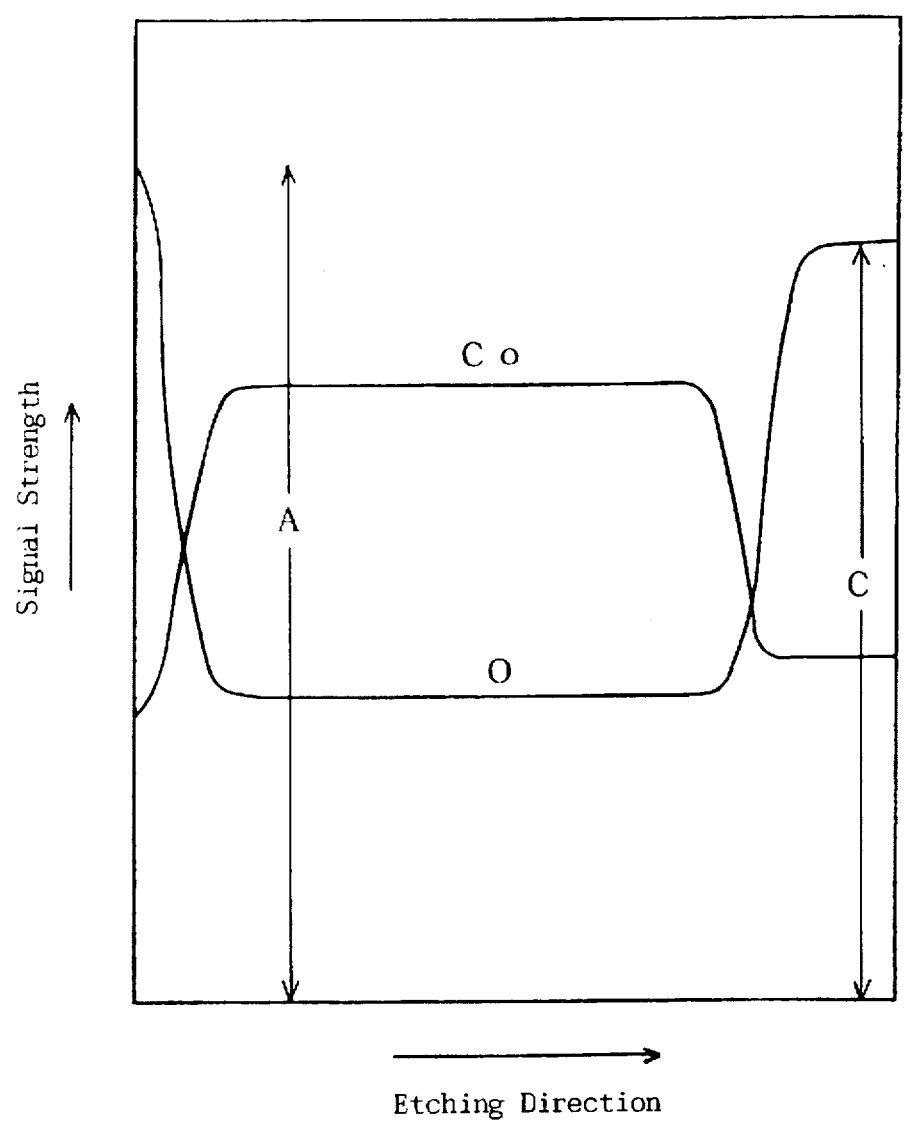
FIG. 13 is a graph showing an example of an Auger Depth profile of a magnetic recording medium of the invention.

FIG. 13 shows the signal strength of Co and O of an Auger Depth profile around the magnetic layer section of the magnetic recording media formed in Examples 3 and 4. In the Auger Depth profile of FIG. 13, C/N shown in FIG. 10 is found when the oxygen peak C at the non-magnetic or low-saturation magnetization bottom layer is 70% or more of the oxygen peak A at the magnetic layer surface. From the magnetic layer side, the correlation between the thickness of the non-magnetic layer with 90–50% oxygen signal strength relative to its peak and the gap of the shielding plate edge on the deposition starting side and the cylindrical can were tested. It was found that 20 nm or less thickness with 90–50% oxygen signal strength of the non-magnetic layer relative to its maximum could be obtained when the gap was 5 mm or less. As in Example 4, when the sub-nozzle made of the aggregated minute tubes was applied, the thickness of the non-magnetic layer with 90–50% oxygen signal strength relative to its peak was further lessened. The properties of a thin film improve by applying such a sub-nozzle probably because the lower range of oxygen signal strength of the non-magnetic layer is narrowed and the boundary between the non-magnetic layer and the magnetic layer becomes clearly distinctive.

In Examples 3-4, a Co—O non-magnetic layer was formed at the initial growth period of a thin film by using a Co evaporating source. As a magnetic material, another metal or alloy can also be applied. For example, when a Co—Ni alloy evaporating source is applied, the same method can be applied so as to form a Co—Ni—O magnetic layer after forming a Co—Ni—O non-magnetic layer. It is also possible to introduce oxygen in depositing two sources including Co and Ni.

Example 5

Figure 14:
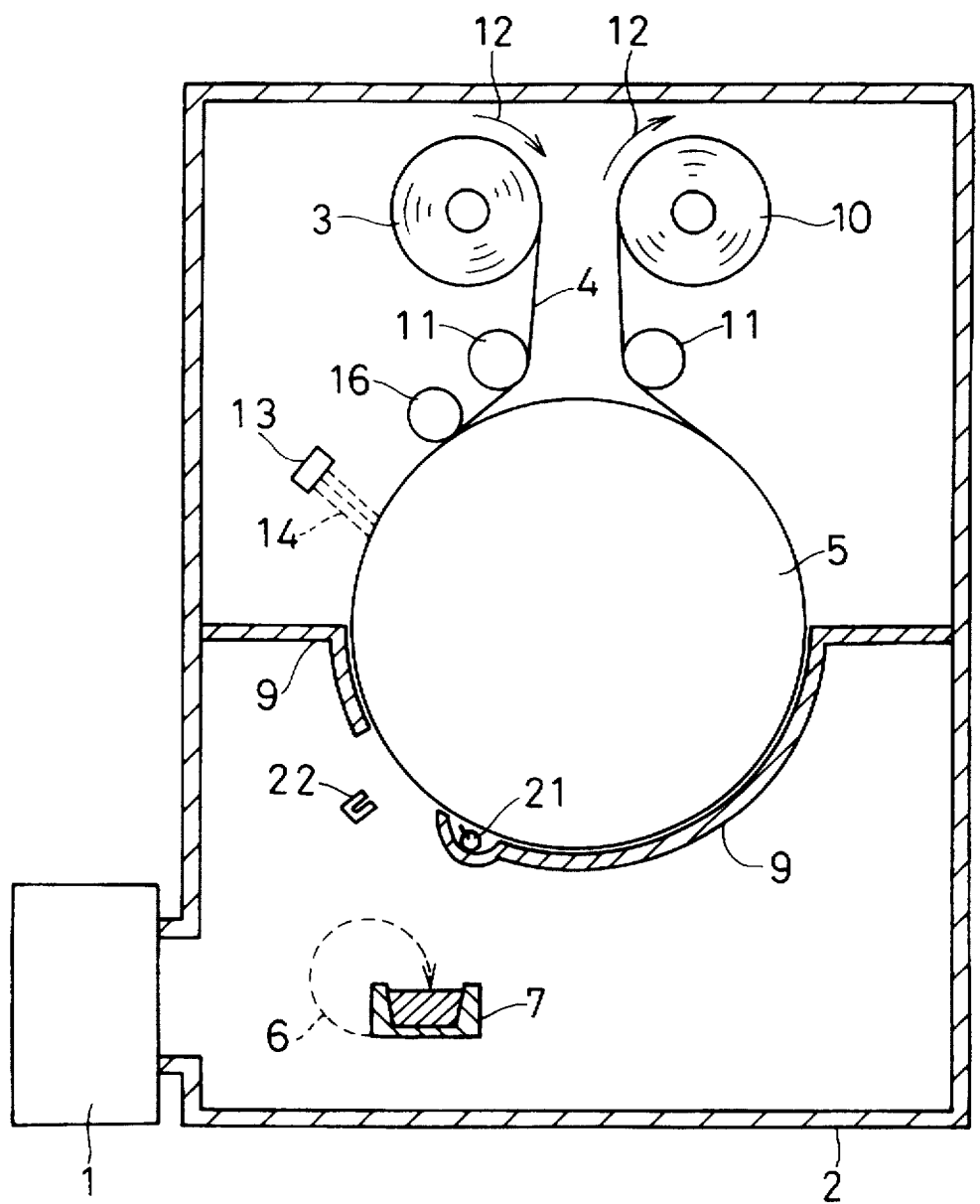
FIG. 14 shows an embodiment of a method and device for manufacturing a thin film of the invention.

The fifth example of this invention is explained. As shown in FIG. 14, a long macromolecular substrate 4 is unwound from an unwinding roller 3 in a rotating direction 12 in a vacuum container 2 which is vacuum exhausted by an exhaust system 1. A deposit is formed on the substrate at the aperture of a shielding plate 9 by the vapors from an evaporation crucible 7 which is irradiated with an electron beam 6, while the substrate is running along the surface of a cylindrical can 5. Then, the substrate is wound by a winding roller 10. In order to increase the adherence between the macromolecular substrate and the can, the substrate can be pressed against the can by a nip roller 16 and then irradiated with an electron beam 14 used for providing adherence from an electron gun 13. The nip roller and the electron gun can be removed from the device when they are unnecessary.

Gas including oxygen is directed to the substrate on the deposition end side of the aperture, and the flux of oxygen gas is oriented to the middle of the aperture from a sub-nozzle which has minute tubes and is positioned outside the vapor flow.

In order to manufacture a thin film magnetic tape, 30 cm wide and 10 μm thick polyethylene terephthalate was applied as a macromolecular substrate. A 200 nm thick Co—O magnetic layer was formed. The incidence angle of vapor to the macromolecular substrate is from 80 to 40 degrees relative to the normal line of the substrate. The extension line of a main nozzle 21 was oriented to the deposition end section, and the extension line of sub-nozzle 22 crossed the substrate on the cylindrical can at the point of the vapor incidence angle of 48 degrees. The cylindrical can was cooled by cooling water which was circulating in the can and had an ordinary temperature. The degree of vacuum in the deposition chamber was about $5\times10^{-5}$ torr.

The magnetic layer of this example was evaluated by the same method as in Example 3.

Figure 15:
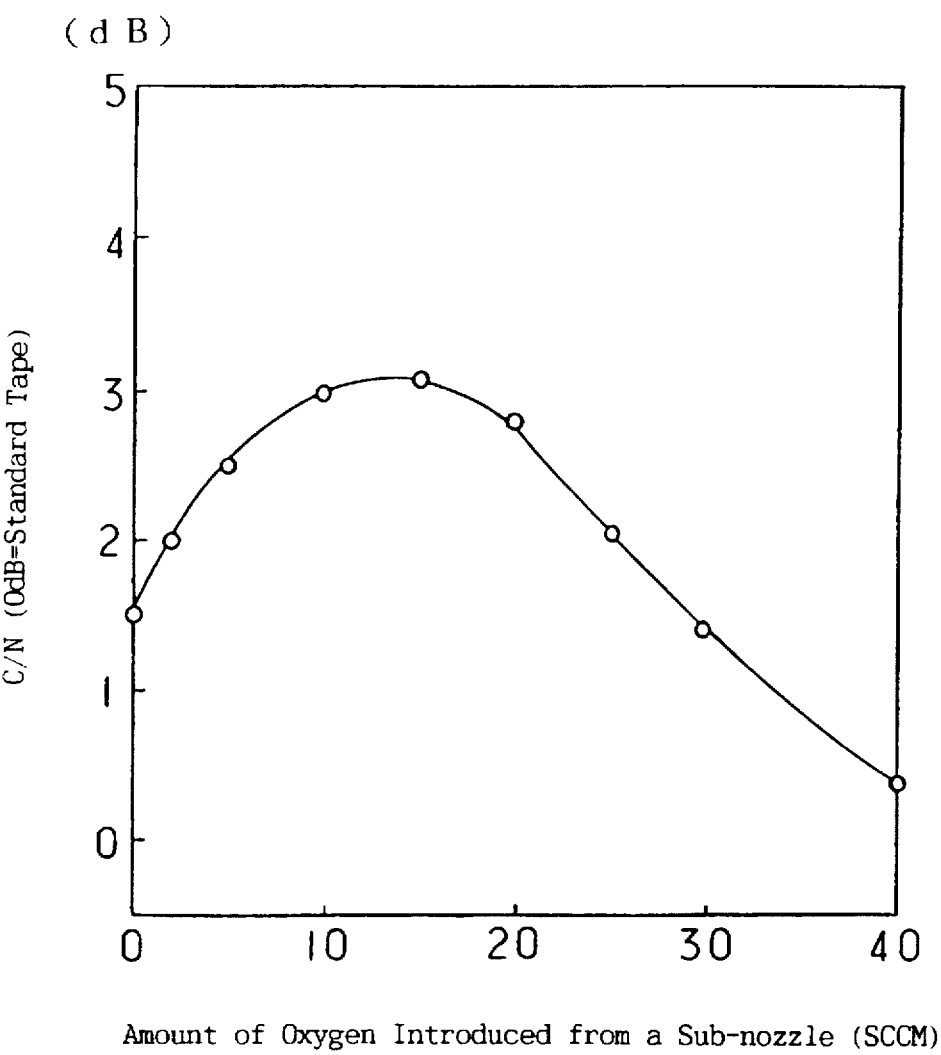
FIG. 15 is a graph showing the recording and reproducing properties of a magnetic tape of the invention which is manufactured by changing the amount of oxygen introduced from a sub-nozzle.

FIG. 15 shows the recording and reproducing properties of a magnetic tape which was manufactured by changing the amount of oxygen introduced from the sub-nozzle. As shown in FIG. 15, C/N improves as oxygen is introduced from the sub-nozzle. This is because a non-magnetic layer or a low-saturation magnetization layer was formed in the mid-growth of the magnetic layer by introducing oxygen from the sub-nozzle, so that noise was reduced and C/N improved since the magnetic layer including the non-magnetic or low-saturation magnetization layer had a pseudo two-layer structure. The formation of the non-magnetic layer or the low-saturation magnetization layer in the mid-growth of the magnetic layer was estimated from the Auger Depth profile of the medium. When the amount of oxygen introduced from the sub-nozzle was too great, vapor was scattered by the gas, so that the recording and reproducing properties declined. The properties improve significantly when the magnetic layer is divided by the extension line of the sub-nozzle and the thickness ratio of a section of the magnetic layer on the substrate side relative to another section on the surface side ranges from 3:1 to 8:1.

Figure 16:
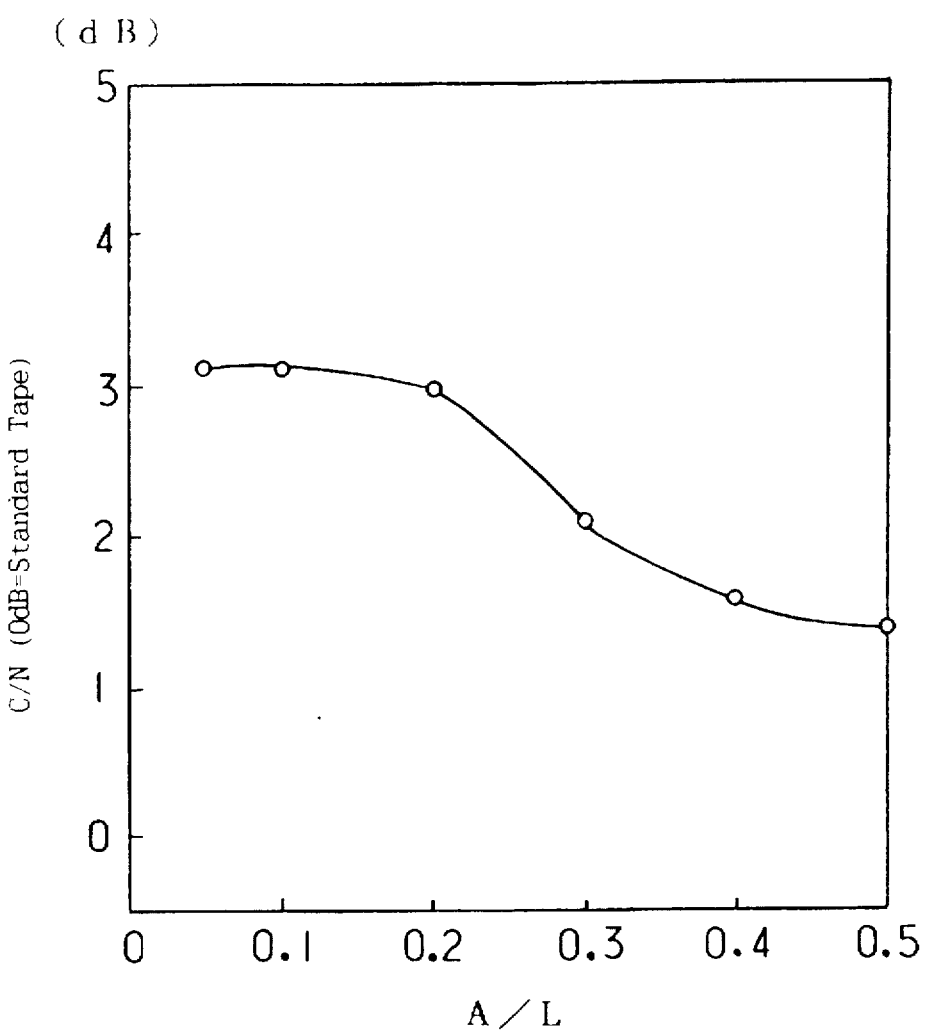
FIG. 16 is a graph showing the correlation between the recording and reproducing properties of a thin film and the shape of a sub-nozzle of the invention.
Figure 17:
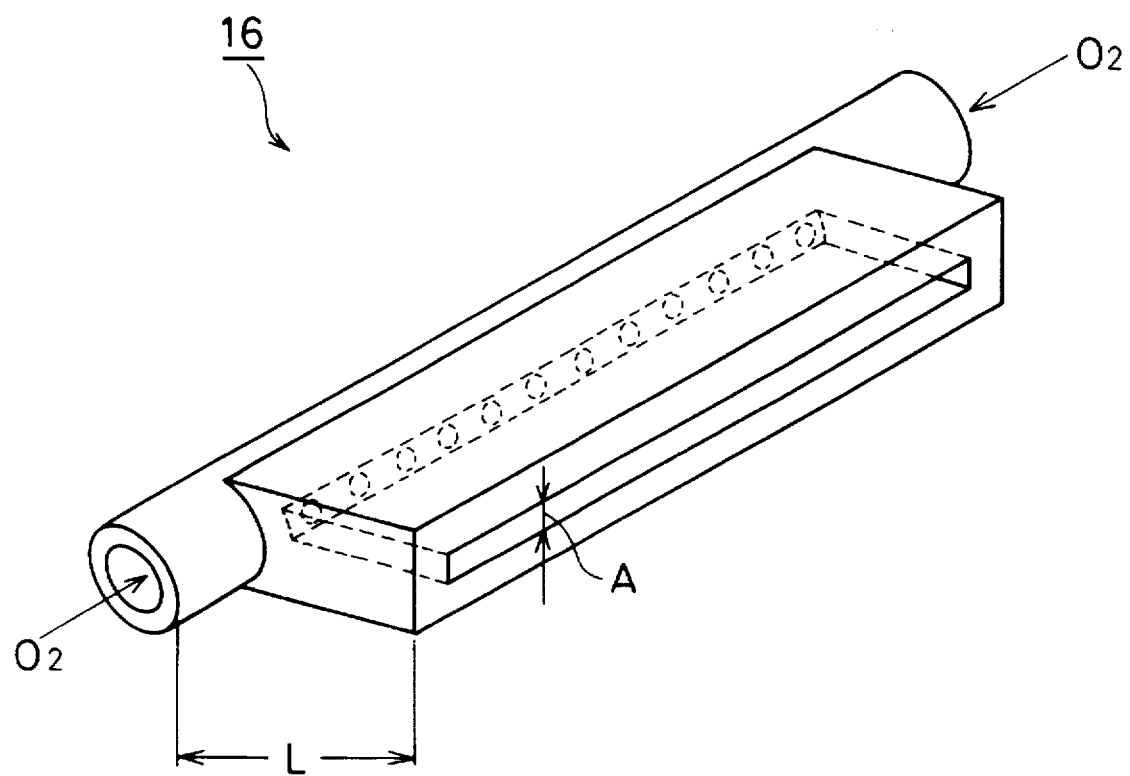
FIG. 17 is a diagram showing the shape of a sub-nozzle of the invention.

FIG. 16 shows the correlation between the shape of the sub-nozzle and the recording and reproducing properties of a thin film. As in FIG. 17, the shape of the sub-nozzle was changed by varying the ratio of nozzle length in a blowing direction (L) relative to nozzle mouth height (A), and the relationship between A/L and the recording and reproducing properties was tested. In FIG. 17, a cylindrical pipe was formed with numerous minute oval holes in the lengthwise direction. The amount of oxygen from the sub-nozzle was 10 SCCM. A/L was 0.2 in FIG. 15. As a result, as shown in FIG. 16, excellent recording and reproducing properties are obtained with 0.2 or less A/L. As A/L becomes small, oxygen flowing from the sub-nozzle reaches the macromolecular substrate as aggregated flux, so that an intermediate non-magnetic layer is formed distinctively. Therefore, the shape of the sub-nozzle should be chosen so as to provide 0.2 or less A/L. In addition, the recording and reproducing properties were improved in Example 5 by applying the sub-nozzle having numerous minute tubes as described in Example 4 and setting L/D equal to 5 or more.

Figure 18:
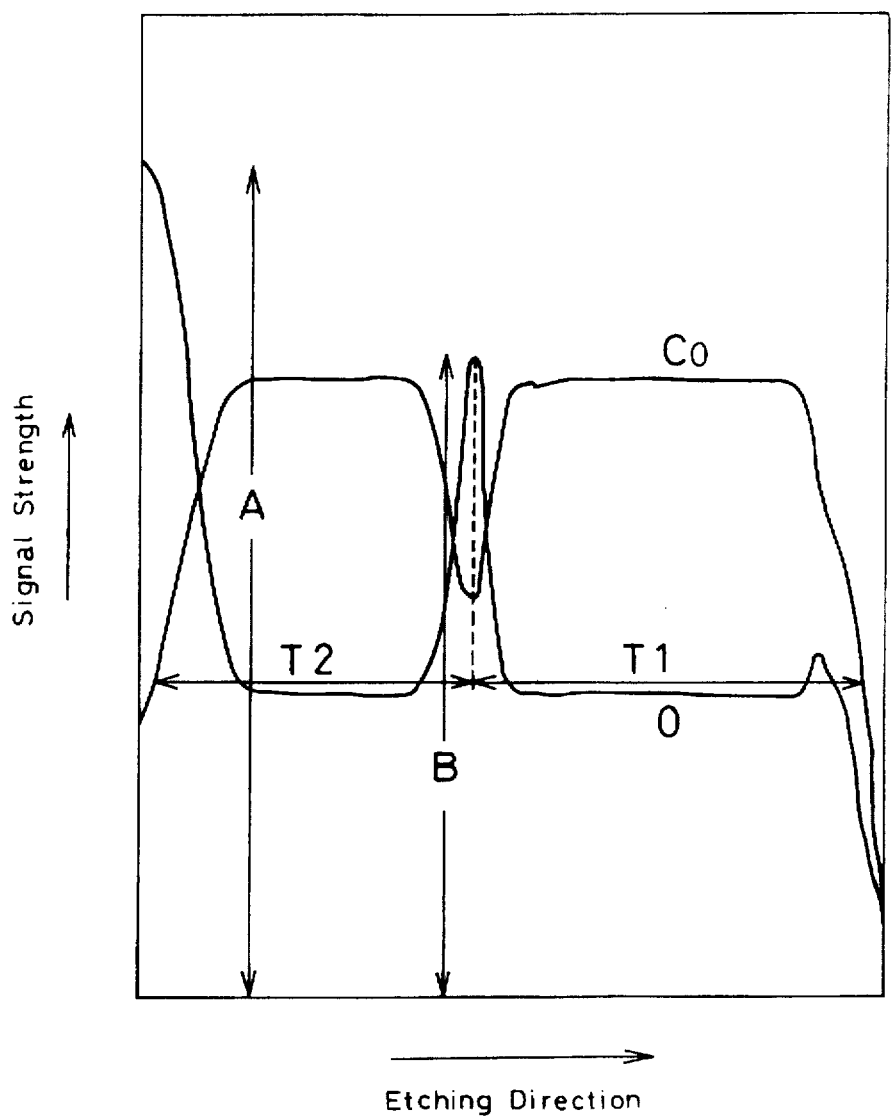
FIG. 18 is a graph showing an example of an Auger Depth profile of a magnetic recording medium of the invention.

The signal strength of Co and oxygen around the magnetic layer of the magnetic recording medium manufactured in Example 5 was measured by an Auger Depth profile, and is shown in FIG. 18. A section where oxygen peak B in the mid-magnetic layer is at least 60% as strong as oxygen peak A at the magnetic layer surface in FIG. 18 corresponds to a section on the right side from where C/N is increasing in FIG. 15. The increase in C/N was clear when $T2/(T1+T2)$ was equal to 11–25%. T1 and T2 are the first and the second part of half the width of Co signal, which is divided by the oxygen peak in the middle of the magnetic layer. T1 is the thickness of the first layer on the substrate side, and T2 is the thickness of the second layer on the magnetic layer surface side. The ratio of the first relative to the second layer of the pseudo two-layered magnetic layer is changed by varying the direction of the extension line of the sub-nozzle.

With respect to A/L shown in FIG. 17 and the width at half the height of the oxygen peak found in the mid-magnetic layer, the width is 20 nm or less when A/L is 0.2 or less. The improvement in properties is clear when A/L is 0.2 or less. By applying the sub-nozzle consisting of minute tubes, the width is 20 nm or less when L/D is 5 or more. In any case, the width at half the height of the oxygen peak found in the mid-magnetic layer becomes large when the amount of oxygen introduced from the sub-nozzle is too great.

Example 6

Figure 19:
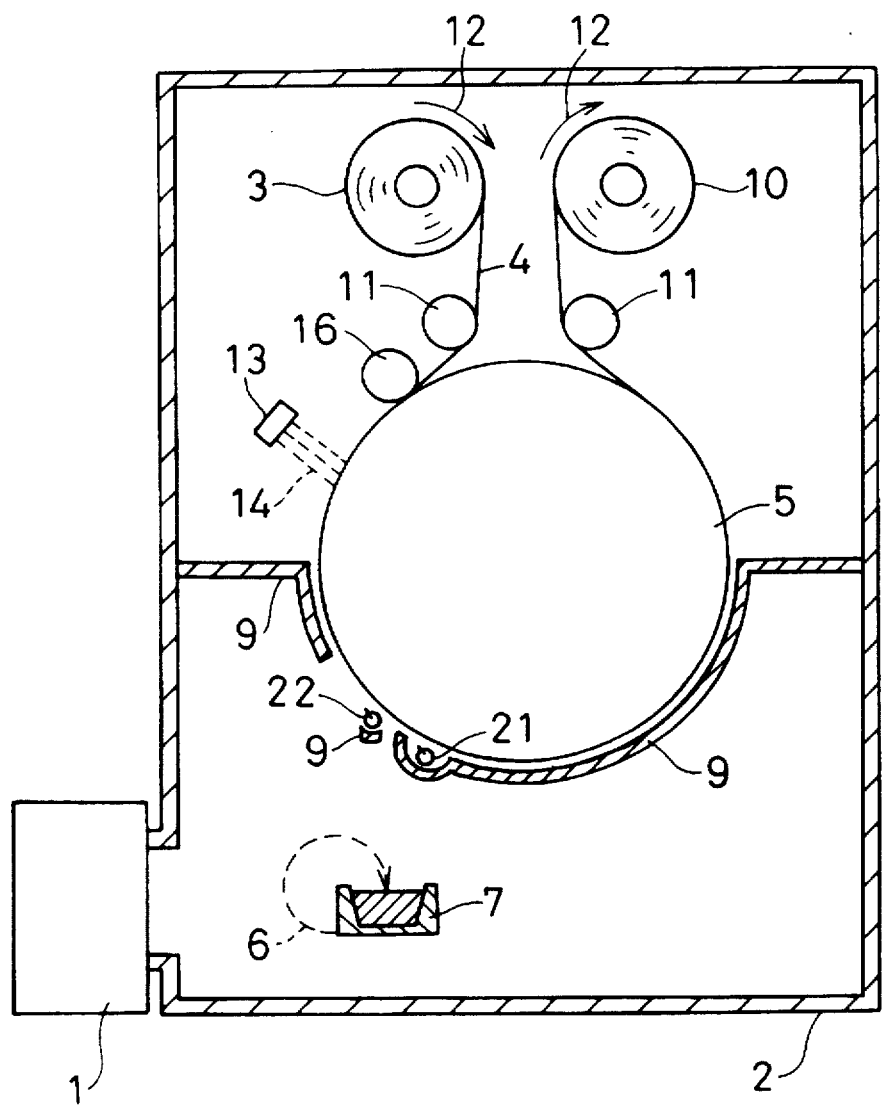
FIG. 19 is a diagram showing an embodiment of a method and device for manufacturing a thin film of the invention.

Another example of this invention is explained. A long substrate 4 is unwound from an unwinding roller 3 in a rotational direction 12 in a vacuum container 2 which is vacuum exhausted by an exhaust system 1 shown in FIG. 19, and a deposit is formed on the substrate at the aperture of a shielding plate 9 by vapor from an evaporation crucible 7, which is irradiated with an electron beam 6 while it is running along the surface of a cylindrical can 5. Then, the substrate is wound by a winding roller 10. The aperture is divided into two parts. By changing the ratio of the 0width of the first aperture relative to that of the second aperture, the contribution rate of film thickness of one aperture relative to another aperture varied from 10:1 to 1:1. Reaction and deposition are carried out by introducing the flux of oxygen gas with a gas-introducing nozzle 8 from the deposition end side of each aperture. In order to increase the adherence between the macromolecular substrate and the can, the macromolecular substrate is pressed against the can by a nip roller 16, and an electron beam 14 for providing adherence can then be irradiated from an electron gun 13 before forming a thin film. In addition, an ion source can be applied to carry out the surface treatment or the like on the substrate. The nip roller, the electron gun and the ion source can be removed from the device when they are unnecessary.

In order to form a thin film magnetic tape in this invention, 30 cm wide and 10 μm thick polyethylene terephthalate was applied as the macromolecular substrate, and a 200 nm thick Co—O magnetic layer was formed. The initial incidence angle of vapor to the macromolecular substrate was 80 degree from the normal line of the substrate at the first aperture, and the closing incidence angle varied from 45 to 54 degrees. On the other hand, the initial incidence angle of vapor to the macromolecular substrate varied from 43 to 52 degrees from the normal line at the second aperture, and the closing incidence angle was 40 degree. In any case, the space between the first and second apertures, an angle of 2 degrees of incidence angle, was shielded. The extension of the gas-introducing nozzle was oriented to the deposition end of each aperture. The cylindrical can was cooled by cooling water circulating in the can and having an ordinary temperature. The degree of vacuum in a deposition room during the film forming process was about $5 \times 10^{-5}$ torr.

The nozzles applied in this example include a box-shaped nozzle shown in FIG. 17 with 200×6×30 mm internal size and having a 200×6 mm mouth which is wider in the direction of substrate width; a box-shaped nozzle with 200×3×30 mm internal size and having a 200×3 mm mouth which is wider in the direction of substrate width; a box-shaped nozzle explained in Example 4 with 200×6×10 mm internal size, being filled with minute tubes having 1 mm internal diameter, and having a 200×6 mm mouth which is wider in the direction of substrate width; or a box-shaped nozzle with 200×6×10 mm internal size, being filled with minute tubes having 2 mm internal diameter, and having 200×6 mm mouth which is wider in the direction of substrate width.

The same method as in Example 3 was applied to evaluate the magnetic layer.

Figure 20:
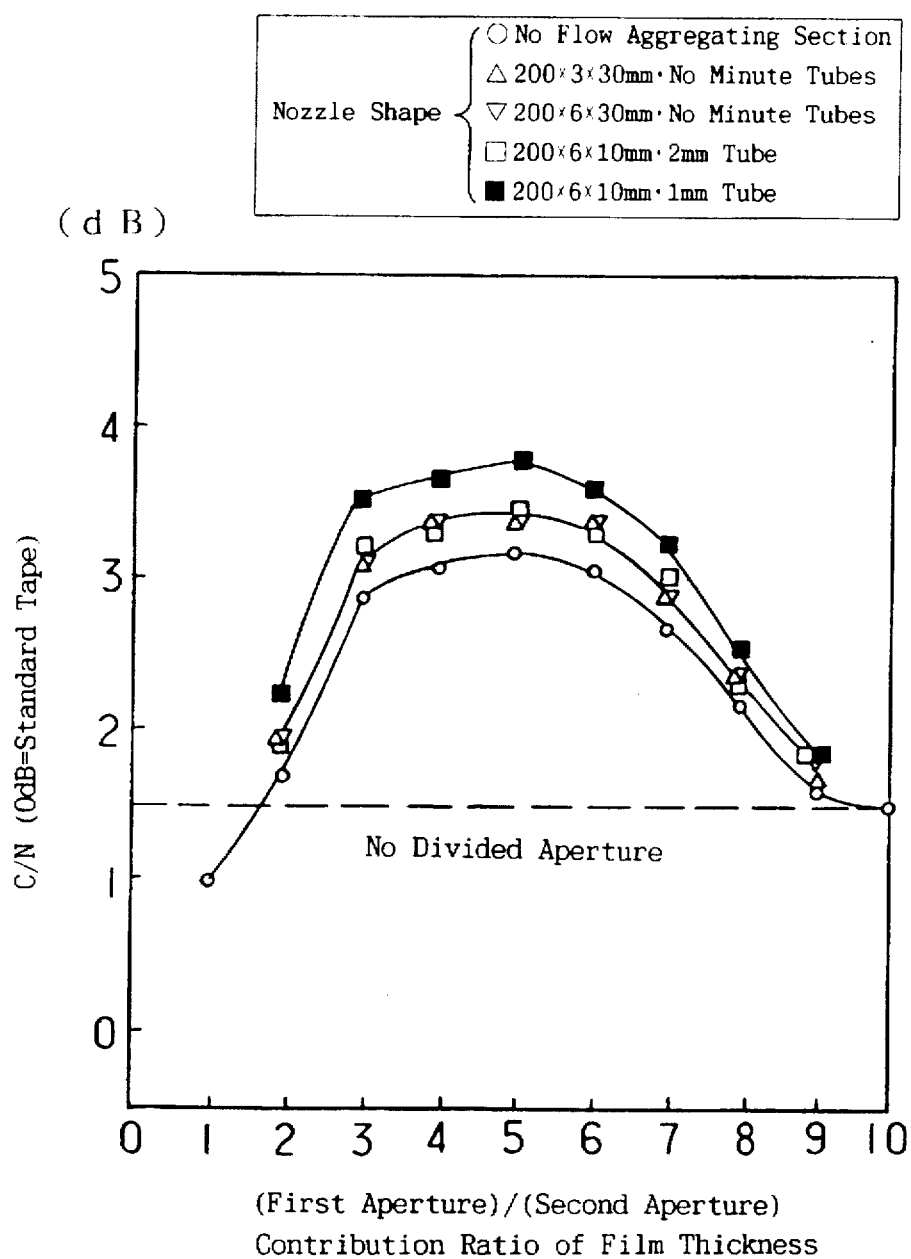
FIG. 20 is a graph showing the recording and reproducing properties of a thin film of the invention when oxygen gas is introduced only from the deposition end of a first aperture.

FIG. 20 shows the recording and reproducing properties measured by introducing the flux of oxygen gas only from the deposition end of the second aperture and by varying the contribution rate of film thickness of the first aperture relative to second aperture from 10:1 to 1:1. FIG. 20 shows the results obtained from the application of a device with no divided aperture and a device with a nozzle having no flow aggregating section (length L) shown in FIG. 17. As shown in FIG. 20, the properties improve by dividing the aperture. In addition, by applying the nozzle having minute tubes, the properties further improve. When the nozzle with no minute tubes was applied, there was no improvement in the properties with 0.2 and 0.1 A/L indicated in FIG. 17. When the nozzle filled with minute tubes was used, the properties improved by changing L/D from 5 to 10. There is no control over the flux of gas in the direction of substrate width when the nozzle with no minute tubes is applied, so that the flux is disturbed slightly in such a direction. On the contrary, when the nozzle filled with minute tubes is applied, the flow of gas is controlled in the direction of substrate width and the effect is clearly shown. In addition, as shown in FIG. 20, the recording and reproducing properties were excellent when the contribution rate of film thickness of the first aperture relative to the second aperture was from 8:1 to 3:1. If the contribution rate is less than ⅛, the effect of dividing the aperture becomes so slight that the result would be similar to the one found from the device with no divided aperture. On the contrary, the rate of covering the entire film with a film having a small incidence angle relative to zero degree normal line of the substrate becomes too large when the contribution rate is more than ⅓. In other words, since a film with insufficient magnetic separation among crystals due to a relatively small incidence angle is grown on the oxidized layer formed at the first aperture, noise is likely to generate from a film formed at the second aperture, so that the improvement in the recording and reproducing properties due to the division of aperture is small.

Figure 21:
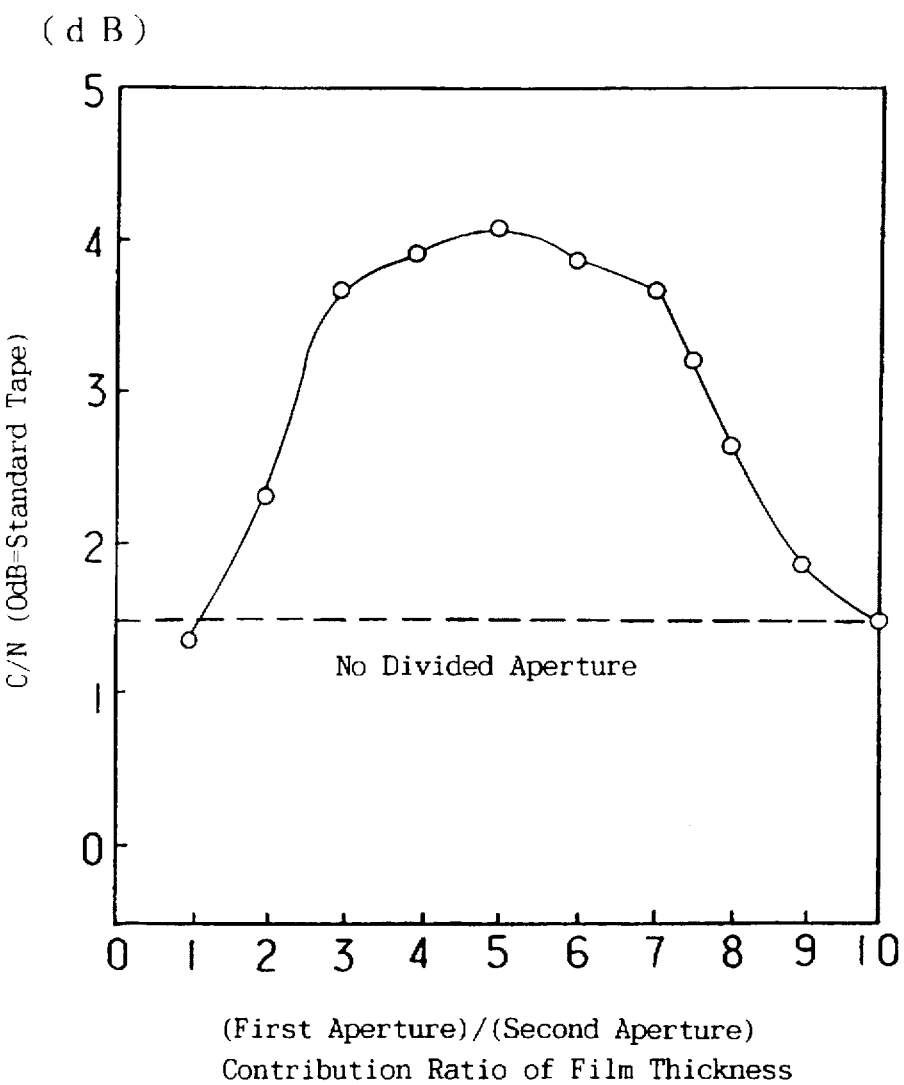
FIG. 21 is a graph showing the recording and reproducing properties of a thin film of the invention when oxygen gas is introduced from the deposition end of both first and second apertures.

FIG. 21 shows the recording and reproducing properties by introducing the flux of oxygen gas from the deposition end of the first and second aperture and by varying the contribution rate of film thickness of the first aperture relative to the second aperture from 10:1 to 1:1. A box-shaped nozzle having 200×6×30 mm internal size and a 200×6 mm mouth which is wider in the direction of substrate width was applied. As shown in FIG. 21, the recording and reproducing properties of a thin film improve by applying subdivided apertures and by dividing oxygen flow and introducing the oxygen at a preferable flow amount from the deposition end. Especially when the contribution rate of film thickness of the first aperture relative to the second aperture was from 8:1 to 3:1, excellent properties were obtained.

Thus, by dividing an aperture and applying a nozzle made of minute tubes, the recording and reproducing properties of a thin film improve. In order to provide excellent recording and reproducing properties, it is also preferable that the contribution rate of film thickness of the first aperture relative to that of the second aperture is from 8:1 to 3:1 and that oxygen is introduced separately to the first and second aperture.

Figure 22:
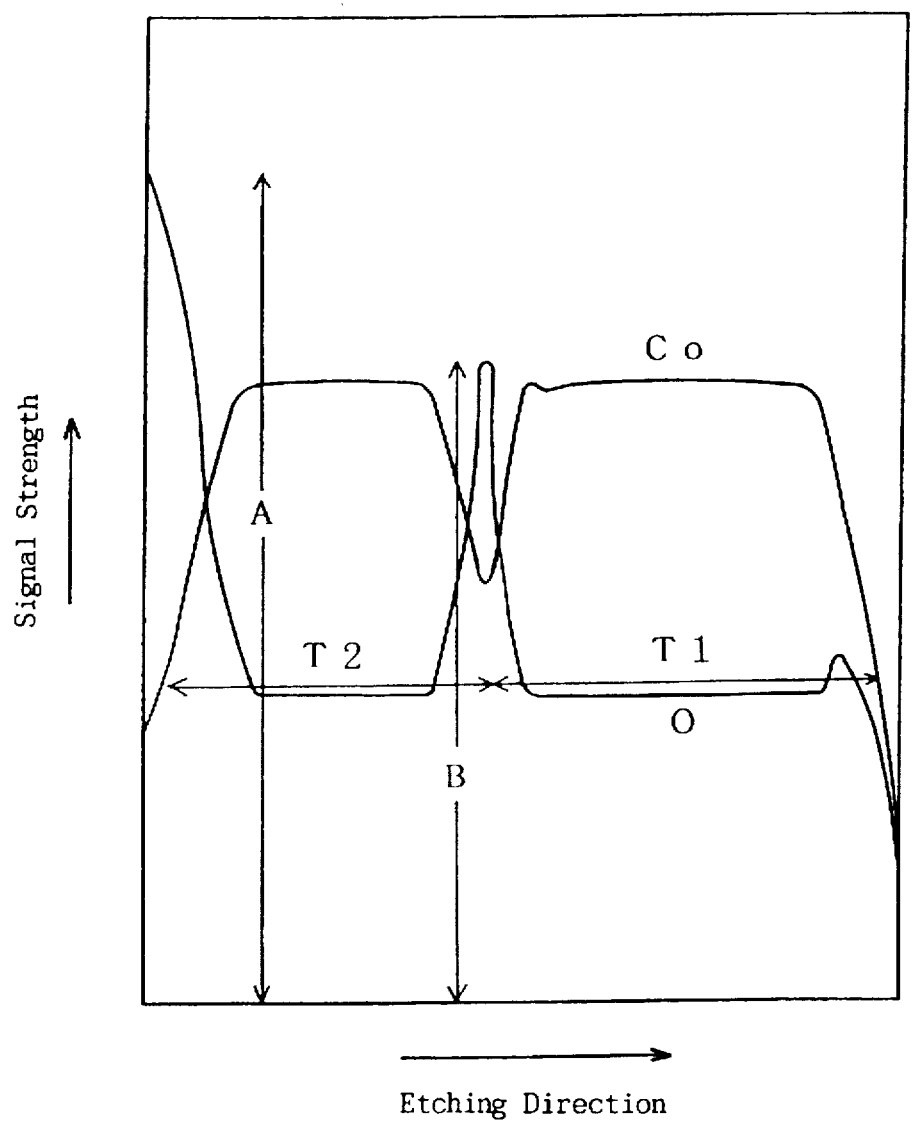
FIG. 22 is a graph showing an example of an Auger Depth profile of a magnetic recording medium of the invention.

The signal strength of Co and oxygen around the magnetic layer of the magnetic recording medium formed in Example 6 was measured by an Auger Depth profile, and is shown in FIG. 22. A section of Auger Depth profile shown in FIG. 22 where oxygen peak B in the mid-magnetic layer is at least 60% as strong as oxygen peak A of the magnetic layer surface corresponds to a section where C/N is increasing in FIGS. 20 and 21. The increase in C/N was clear when T2/(T1+T2) was equal to 11–25%. T1 and T2 are the first and second part of half the width of Co signal, which is divided by the oxygen peak in the middle of the magnetic layer. T1 is the thickness of the first layer on the substrate, and T2 is the thickness of the second layer on the magnetic surface side. The layer thickness ratio of the two-layered magnetic layer is changed by varying aperture ratios.

Figure 25:
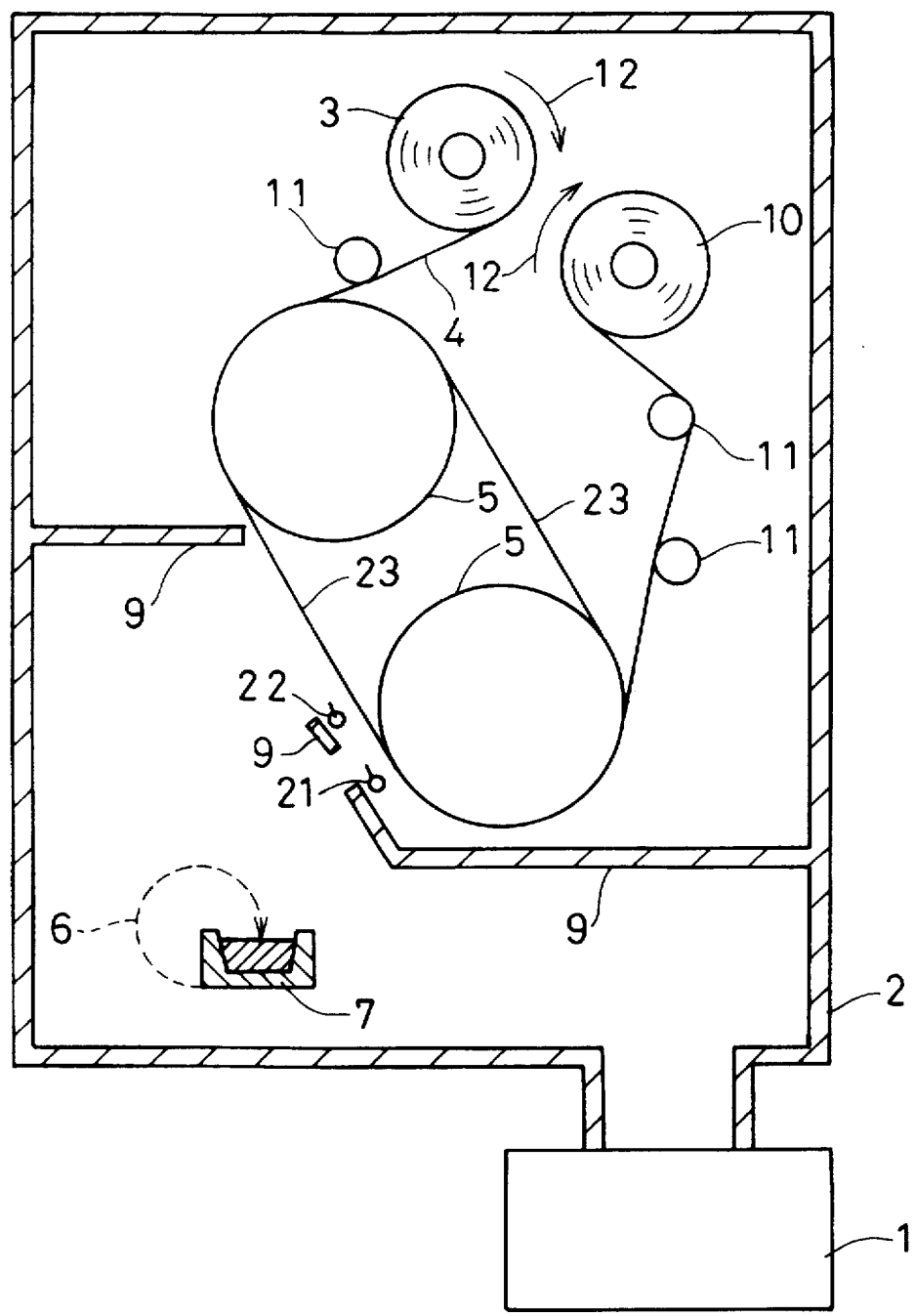
FIG. 25 is a diagram showing an embodiment of a method and device for manufacturing a thin film of the invention when a belt is applied as a supporting body for a macromolecular substrate.
Figure 26:
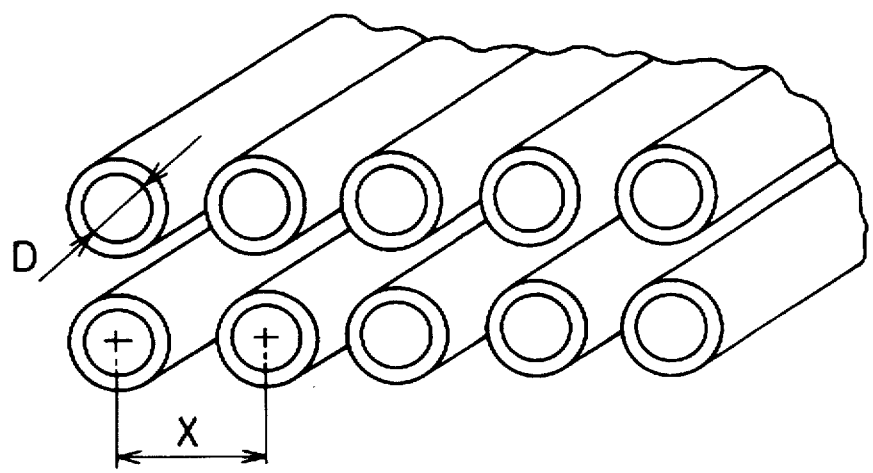
FIG. 26 is a diagram showing the corretion between the inside diameter of a minute tube of the gas introducing nozzle and the center distance of neighboring tubes.

In Examples 1–6, the cylindrical can was applied as a supporting body for the macromolecular substrate. However, a belt-type supporting body can also be applied in this invention. A device shown in FIG. 25 can provide the same effect as in Example 6. In other words, a long substrate 4 is unwound from an unwinding roller 3 in a rotational direction 12 in a vacuum container 2, which is vacuum exhausted by an exhaust system 1. A deposit is formed on the substrate at the aperture of a shielding plate 9 by an evaporating source 7 which is irradiated with an electron beam 6, while the substrate is running along the surface of a supporting belt 23. Then, the substrate is wound by a winding roller 10. The aperture is divided into two sections. The flux of oxygen gas is introduced by using a gas-introducing main nozzle 21 and a gas-introducing sub-nozzle 22 from the deposition end side of each aperture so as to react and deposit. The ratio of a first aperture width in a running direction relative to a second aperture width is determined by setting the contribution ratio of film thickness of the first aperture relative to the second aperture from 8:1 to 3:1, so that excellent recording and reproducing properties are provided. In order to increase adherence between the macromolecular substrate and the can, the substrate can be pressed against the can by a nip roller, and then an electron beam used for adherence can be irradiated from an electron gun before forming a thin film. As a supporting belt, a metal belt such as a seamless stainless belt and a flexible material such as a macromolecular belt can be applied. The thickness of the supporting belt is determined in consideration of heat conductivity or bending properties of a material. For instance, when a stainless steel belt is applied, the thickness is preferably from 0.3 mm to 0.6 mm.

Figure 23:
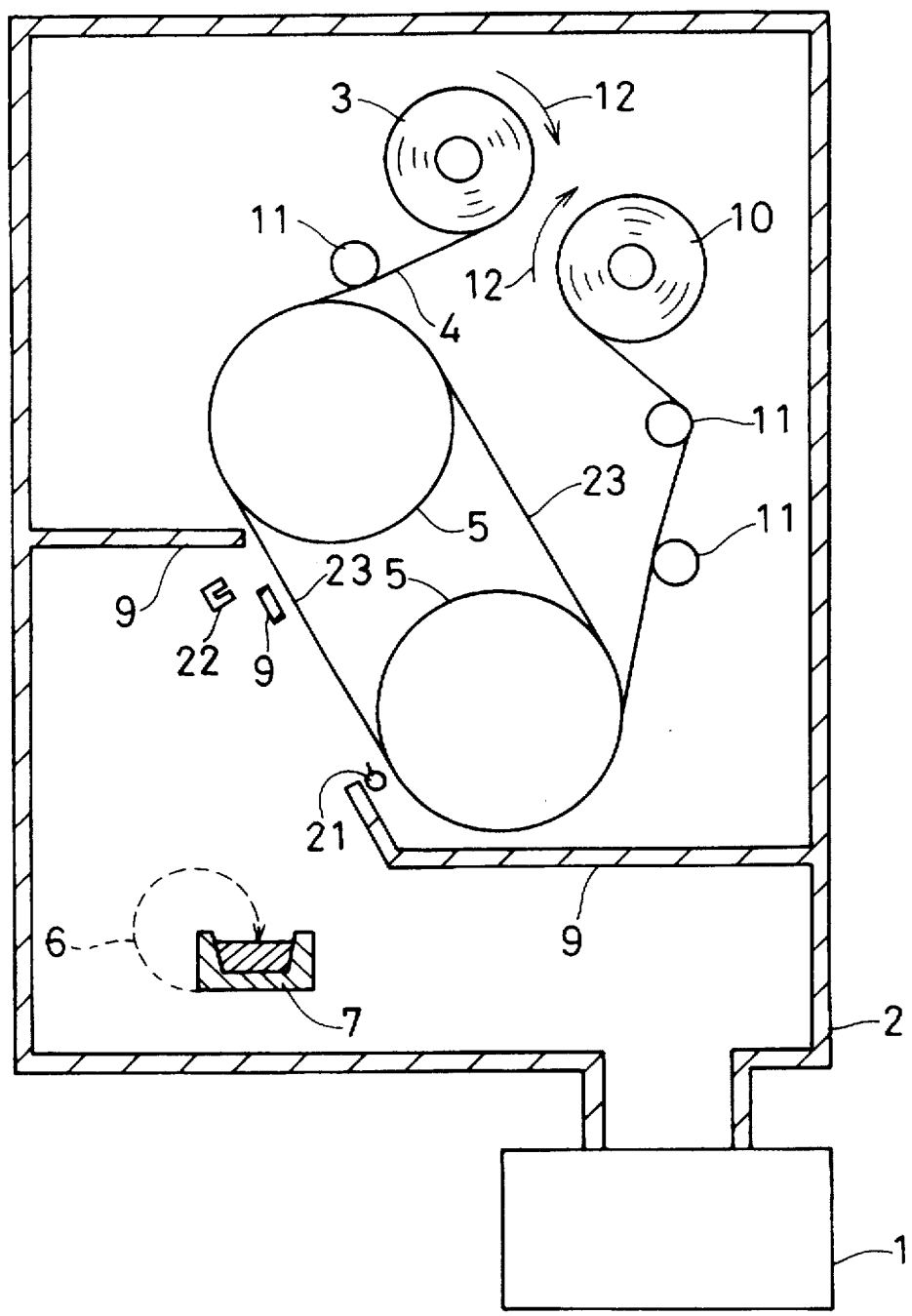
FIG. 23 is a diagram showing an embodiment of a method and device for manufacturing a thin film of the invention when a belt is used as a supporting body for a macromolecular substrate.

The device shown in FIG. 23 can provide the same effect as in Examples 3 and 4. In other words, a long substrate 4 is unwound in a rotational direction 12 from an unwounding roller 3 in a vacuum container 2, which is vacuum exhausted by an exhause system 1. A deposit is formed on the substrate at the aperture of a shielding plate 9 by an evaporating source 7, which is irradiated with an electron beam 6 while the substrate is running along the surface of a supporting belt 17. Then, the belt is wound by a winding roller 10.

Reaction and deposition are carried out by providing gas including oxygen from a gas-introducing main nozzle 21 on the deposition end side of a main aperture to the substrate. In addition, the flux of oxygen gas is oriented from a sub-nozzle 22 which is on the top side of the shielding main aperture end on the deposition starting side and is close to the supporting belt. A sub-aperture is applied in the shielding plate on the deposition starting side so as to adhere some of the vapor passing through the sub-aperture to the substrate. The flow of oxygen gas from the sub-nozzle is oriented to a section where vapor passing through the sub-aperture adheres to the substrate. Aggregated minute tubes are applied as the sub-nozzle so as to introduce oxygen gas, thus further improving the recording and reproducing properties of a thin film as described in Example 4. In order to increase adherence between the macromolecular substrate and the can, the substrate can be pressed against the can by a nip roller, and an electron beam used for adherence can then be irradiated from an electron gun before forming a thin film. Furthermore, an ion source can be applied to carry out the surface treatment or the like on the substrate. As a supporting belt, a metal belt such as a seamless stainless belt and a flexible belt such as a macromolecule belt can be used. The thickness of the supporting belt depends on the heat conductivity and bending properties of a material. For example, when a stainless steel belt is used, the thickness is preferably about 0.3–0.6 mm.

Figure 24:
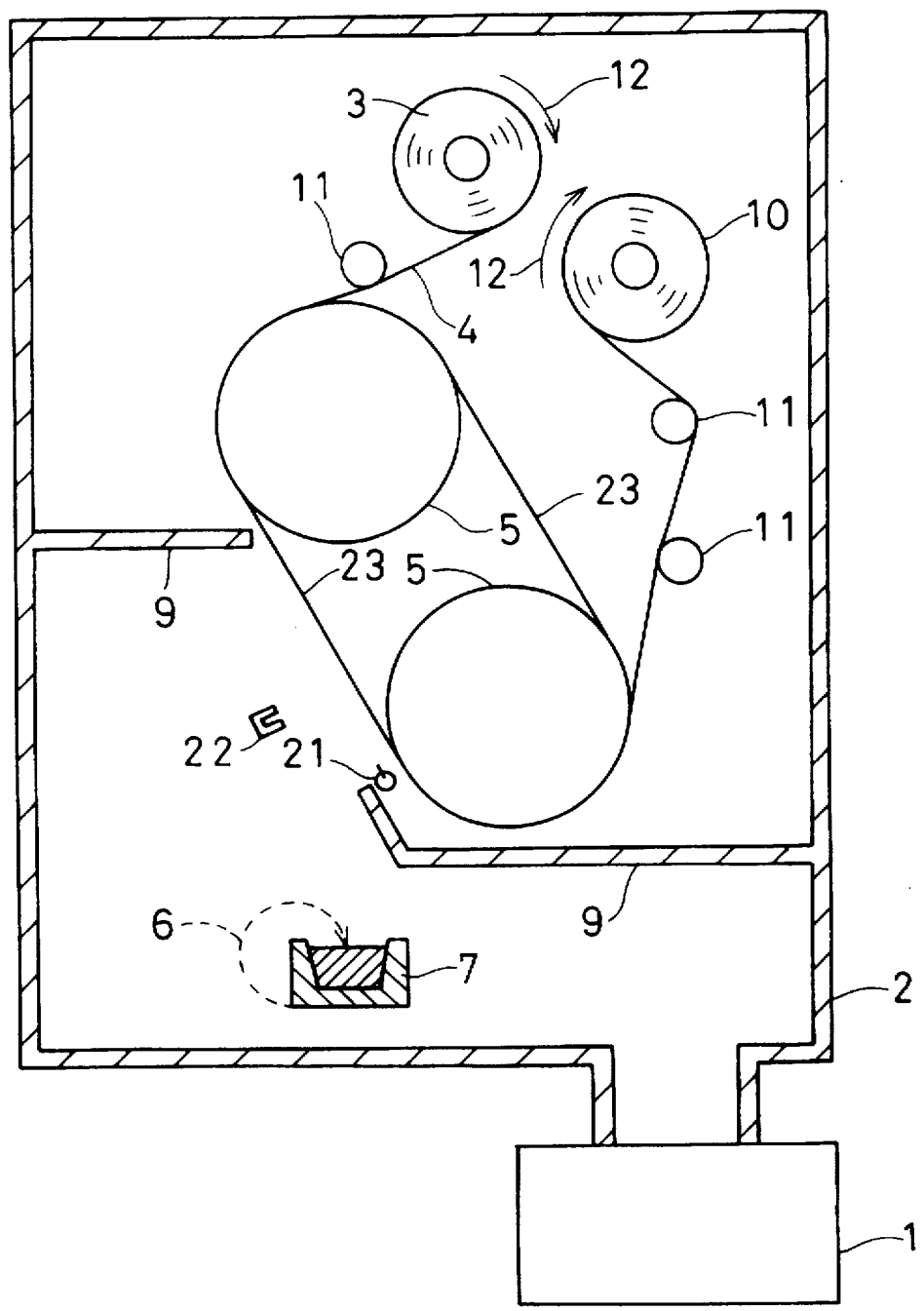
FIG. 24 is a diagram showing an embodiment of a method and device for manufacturing a thin film of the invention when a belt is used as a supporting body for a macromolecular substrate.

The device shown in FIG. 24 can provide the same effect as in Example 5. In other words, a long substrate 4 is unwound from unwinding roller 3 from a rotational direction 12 in a vacuum container 2, which is vacuum exhausted by an exhaust system 1. A deposit is formed on the substrate at the aperture of a shielding plate 9 by an evaporating source 7 irradiated with an electron beam 6, while the substrate is running along the surface of a supporting belt 7. The substrate is then wound by a winding roller 10. Oxygen gas is directed to the substrate from the deposition end of a main aperture. The flux of oxygen gas is oriented to the middle of the aperture from the sub-nozzle positioned outside of vapor flux, which is forming the magnetic layer. In FIG. 24, a non-magnetic layer or a low-saturation magnetization layer is formed in the mid-growth of the magnetic layer by introducing oxygen from the sub-nozzle. As a result, the magnetic layer has a pseudo two-layer structure, thus lowering noise and improving C/N. The formation of a non-magnetic layer or a low-saturation magnetization layer in the mid-growth of the magnetic layer was estimated from the Auger Depth profile of the medium. In order to increase adherence between the macromolecular substrate and the can, the substrate can be pressed against the can by a nip roller, and an electron beam for generating adherence can then be irradiated from an electron gun before forming a thin film. Furthermore, an ion source can also be applied to carry out the surface treatment or the like on the substrate. As a supporting belt, a metal belt such as a seamless stainless belt and a flexible belt such as a macromolecule belt can be applied. The thickness of a supporting belt depends on the heat conductivity and bending properties of a material. For example, when a stainless steel belt is applied, the thickness is about from 0.3–0.6 mm.

Polyethylene terephthalate was applied as a substrate in Examples 1–6. However, other materials including macromolecular materials such as polyethylene naphthalate, polyolefine, polyamide and polyimide can also be applied as a substrate. In addition, even though only the formation of a Co—O magnetic layer was described in the examples, the same effect is expected by applying another oxide thin film such as Co—Ni—O. The invention is also effective when a thin film is formed after forming a bottom layer. Furthermore, the invention is not limited to magnetic materials. The invention is applicable to various materials such as Si, and for carrying out reaction deposition with reaction gas such as oxygen and reaction deposition between multi-elements and gas. The invention can also provide properties which were obtained only by a conventional multi-layer process. For instance, the invention can be applied to form an improved liquid crystal oriented film, transparent electrode film and capacitor which could not have been obtained from a conventional vacuum deposition method.

Reaction gas mentioned in the invention generates a chemical reaction in a film which is formed by vacuum deposition, and is then absorbed by the film. If a high-frequency excitation is also carried out in the invention, any gas except inert gas can be applicable. In addition to the oxygen gas mentioned above, ozone gas or the like can also be applied. Reaction with nitrogen monoxide, nitrogen dioxide, carbon monoxide, carbon dioxide, chlorine gas or the like is also possible in the invention. In an active atmosphere such as a high-frequency excitation atmosphere, nitrogen gas also functions as reaction gas as it does in a sputtering method. A preferable degree of vacuum during vacuum deposition depends on an evaporation source. However, the degree which is applied for a general vacuum deposition process is applicable to form a film in the invention. More specifically, the degree of deposition is $1 \times 10^{-2}$ torr or less. Different from a resistance heating method or an induction heating method, $1 \times 10^{-3}$ torr or less degree of deposition is preferably applied in an electron beam deposition method so as to provide a high voltage beam stably. However, if differential pressure with a film forming region is maintained by a differential pressure plate or the like, the degree of vacuum of the film forming region can be more than $1 \times 10^{-3}$. When an ion beam deposition is applied, the degree of vacuum around an ion source should be considered.

The flux of gas should be kept orderly by setting a nozzle and a film forming section as close as possible in a poor quality of vacuum (high pressure) atmosphere, so that the disorder of gas flux and collision among atoms are prevented. The frequency of collision decreases significantly with $1 \times 10^{-4}$ torr or less degree of pressure. Thus, it is preferable to form a thin film with $1 \times 10^{-4}$ torr degree of vacuum. There is no particular limitation on the number of nozzles. However, when more than one nozzle is applied, the flux of gas becomes disorderly as soon as gas flows cross each other. Thus, the nozzles should be disposed without crossing gas flows.

Furthermore, the incidence angle of deposition is not limited to the one mentioned in the examples. The incidence angle can be changed in accordance with various purposes and objectives.

Besides an electron beam deposition method, other deposition methods such as an induction heating method, a resistance heating method and an ion plating method can also be applied in the invention. In addition to a continuous deposition method of shifting from a high incidence angle to a low incidence angle mentioned in the example of the invention, a continuous deposition method of shifting from a low incidence angle to a high incidence angle, or a continuous deposition method applying mainly a vertical incidence angle can also be applied in the invention. Another deposition method in which a substrate is deposited with or without being rotated is also applicable to the invention, so that the amount of introduced gas can be reduced.

The invention may be embodied in other forms without departing from the spirit or essential characteristics thereof. The embodiments disclosed in this application are to be considered in all respects as illustrative and not restrictive, the scope of the invention is indicated by the appended claims rather than by the foregoing description, and all changes which come within the meaning and range of equivalency of the claims are intended to be embraced therein.

What is claimed is:

1. A magnetic recording medium, comprising:

a substrate;

a magnetic layer formed on the substrate or formed on a bottom layer that is formed on the substrate, the magnetic layer having a lower boundary adjacent the substrate or the bottom layer and an upper surface opposite the lower boundary;

wherein an oxygen signal strength of an Auger Depth profile measured from the upper surface of the magnetic layer has at least a first peak at the surface of the magnetic layer and a second peak positioned between the upper surface and the lower boundary of the magnetic layer at a depth of 11–25% below the upper surface with respect to the thickness of the magnetic layer, the second peak having a signal strength that is at least 60% as strong as that of the first peak.

2. The magnetic recording medium according to claim 1, wherein the portion of the magnetic layer corresponding to the second peak has a thickness no greater than 20 nm for the signal strength that is one half the height of the second peak.

3. The magnetic recording medium according to claim 1, wherein the magnetic layer comprises at least Co and O as its main components.

4. A magnetic recording medium, comprising:

a substrate;

a non-magnetic layer formed on the substrate;

a magnetic layer formed on the non-magnetic layer, the magnetic layer having a lower boundary adjacent the non-magnetic layer and an upper surface opposite the lower boundary;

wherein the non-magnetic layer comprises an oxide of atoms of the magnetic layer, an oxygen signal strength of an Auger Depth profile measured from the upper surface of the magnetic layer has at least a first peak at the upper surface of the magnetic layer and a second peak at said non-magnetic layer, the signal of the second peak being at least 70% as strong as the signal of the first peak, the portion of the non-magnetic layer corresponding to the second peak having a thickness that is no more than 20 nm for the signal strength that is 90–50% the height of the second peak.

5. The magnetic recording medium according to claim 4, wherein the magnetic layer comprises at least Co and O as its main components.

* * * * *